(12) United States Patent
Li et al.

(10) Patent No.: US 10,693,416 B2
(45) Date of Patent: Jun. 23, 2020

(54) PHASE-SELECTIVE ENTRAINMENT OF NONLINEAR OSCILLATOR ENSEMBLES

(71) Applicant: Washington University, St. Louis, MO (US)

(72) Inventors: Jr-Shin Li, St. Louis, MO (US); Anatoly Zlotnik, St. Louis, MO (US)

(73) Assignee: Washington University, St. Louis, MO (US)

( * ) Notice: Subject to any disclaimer, the term of this patent is extended or adjusted under 35 U.S.C. 154(b) by 710 days.

(21) Appl. No.: 15/436,582

(22) Filed: Feb. 17, 2017

(65) Prior Publication Data

US 2017/0237398 A1 Aug. 17, 2017
US 2018/0097478 A9 Apr. 5, 2018

Related U.S. Application Data

(60) Provisional application No. 62/296,421, filed on Feb. 17, 2016.

(51) Int. Cl.
*H03B 27/00* (2006.01)
(52) U.S. Cl.
CPC ................................. *H03B 27/00* (2013.01)
(58) Field of Classification Search
CPC .................................................. H03B 27/00
See application file for complete search history.

(56) References Cited

U.S. PATENT DOCUMENTS 6,700,452 B1 * 3/2004 Shaeffer .................. H03B 5/18
                                                  331/167
9,680,414 B1 * 6/2017 Chen ........................ H03B 5/30

OTHER PUBLICATIONS

Ufilhaas et al. "Neural Synchrony in Brain Disorders: Relevance for Cognitive Dysfunctions and Pathophysiology," Neuron, 52(1): 155-168 (2006).
Winfree, A.T. Editor, "The Geometry of Biological Time," Biomathematics, vol. 8, Springer-Verlag, New York, 1980 (543 pages).
Zhai et al., "Desynchronization of Coupled Electrochemical Oscillators with Pulse Stimulations," Physical Review E, 71(6): 065202-1 to 065202-4 (2005).
Zlotnik et al., "Optimal Entrainment of Neural Oscillator Ensembles," J. Neural Engineering, 9(4): 046015 (2012).
Zlotnik et al. "Optimal Waveform for Fast Entrainment of Weakly Forced Nonlinear Oscillators," Physical Review Letters, 111(2): 024102-1 to 024102-5 (2013).
Zlotnik et al. "Optimal subharmonic entrainment of weakly forced nonlinear oscillators," SIAM J. Applied Dynamical Systems, 13(4): 1654-1693 (2014).

(Continued)

*Primary Examiner* — Tan V Mai
(74) *Attorney, Agent, or Firm* — Armstrong Teasdale LLP

(57) ABSTRACT

A system for entraining an oscillator ensemble is disclosed that includes a plurality of oscillators in an entrained phase pattern. The system includes an entrainment device operatively coupled to each non-linear oscillator of the oscillator ensemble, and the entrainment control device is configured to deliver a $2\pi$-periodic control signal $v(\theta)$ to all oscillators of the plurality of oscillators to induce the entrained phase pattern.

10 Claims, 21 Drawing Sheets
(19 of 21 Drawing Sheet(s) Filed in Color)

(56) References Cited

OTHER PUBLICATIONS

Andronov, A.A. et al., "Theory of oscillators," original title, Teoriya kolebanii, published 1937; translated from Russian by F. Immirzi; the translated edition and abridged by W. Fishwick, Oxford [etc.] : Pergamon Press, International Series on Monographs in Physics, vol. 4: 1-815 (1966).
Arenas et al., "Synchronization in Complex Networks," Physics Reports, 469(3): 93-153 (2008).
Brown et al., "On the Phase Reduction and Response Dynamics of Neural Oscillator Populations," Neural Computation, 16(4): 673-715 (2004).
Buzsaki et al., "Neuronal Oscillations in Cortical Networks," Science, 304(5679): 1926-1929 (2004).
Cornfeld et al., "Ergodic Theory: Definition of Dynamical Systems," vol. 245, of Grundlehren der Mathematischen Wissenschaften, Springer-Verlag, Berlin (1982).
Dasanayake et al., "Optimal Design of Minimum-Power Stimuli for Phase Models of Neuron Oscillators," Physical Review E, 83(6): 061916 (2011).
Dasanayake et al., "Constrained Charge-Balanced Minimum-Power Controls for Spiking Neuron Oscillators," Systems & Control Letters, 75: 124-130 (2015).
Dorfler et al., "Synchronization in Complex Oscillator Networks and Smart Grids," PNAS, 110(6): 2005-2010 (2013).
Dorfler et al., "Synchronization in Complex Networks of Phase Oscillators: A Survey," Automatica, 50(6): 1539-1564 (2014).
Efimov, D. et al., "Controlling the phase of an oscillator: A Phase Response Curve Approach," In Proceedingts of the 48th IEEE Conference on Decision & Control (CDC), Shanghai, China, Dec. 15-18, 2009, pp. 7692-7697 (2009).
Efimov, D. "Phase resetting control based on direct phase response curve," Journal of Mathematical Biology, 63(5): 855-879, 2011.
Epstein et al., Editors, "An Introduction to Nonlinear Chemical Dynamics: Oscillations, Waves, Patterns, and Chaos," (Topics in Physical Chemistry). Oxford University Press, NY (1998).
Ermentrout, B. "Type I Membranes, Phase Reselling Curves, and Synchrony," Neural Computation, 8(5): 979-1001 (1996).
Ermentrout, B., "Simulating, Analyzing, and Animating Dynamical Systems: A Guide to XPPAUT for Researchers and Students," SIAM, Philadelphia, 305 pages (2002).
Galan et al., "Efficient Estimation of Phase-Resetting Curves in Real Neurons and its Significance for Neural-Network Modeling," Physical Review Letters, 94(15): 158101 (2005).
Glass, L. "Synchronization and rhythmic processes in physiology," Nature, 410(6825):277-284 (2001).
Good et al., "Control of Synchronization of Brain Dynamics Leads to Control of Epileptic Seizures in Rodents," International Journal of Neural Systems, 19(3): 173-196 (2009).
Gooley et al., "Spectral Responses of the Human Circadian System Depend on the Irradiance and Duration of Exposure to Light," Science Translational Medicine, 2(31): 31ra33 (9 pages) (2010).
Govaerts et al., "Computation of the Phase Response Curve: A Direct Numerical Approach," Neural Computation, 18(4): 817-847 (2006).
Guckenheimer, J. "Isochrons and Phaseless Sets," Journal of Mathematical Biology, 1(3): 259-273 (1975).
Guevara et al., "Phase Locking, Period Doubling Bifurcations and Chaos in a Mathematical Model of a Periodically Driven Oscillator," Journal of Mathematical Biology, 14(1): 1-23 (1982).
Guillamon et al., "A Computational and Geometric Approach to Phase Reselling Curves and Surfaces," SIAM Journal on Applied Dynamical Systems, 8(3): 1005-1042 (2009).
Hammond et al., "Pathological Synchronization in Parkinson's Disease: Networks, Models and Treatments," Trends in Neurosciences, 30(7): 357-364 (2007).
Hoppensteadt et al, Editors, "Weakly Connected Neural Networks," Springer-Verlag New York Inc., NJ, 1997, (Table of Contents 13 pages).
Hoppensteadt et al., "Oscillatory Neurocomputers with Dynamic Connectivity," Physical Review Letters, 82(14): 2983-2986 (1999).
Hunter et al., "Amplitude and Frequency Dependence of Spike Timing: Implications for Dynamic Regulation," J. Neurophysiology, 90(1): 387-394 (2003).
Izhikevich, E. M. "Synchronization of Elliptic Bursters," SIAM Review, 43(2): 315-344 (2001).
Izhikevich, E. "Dynamical Systems in Neuroscience: The Geometry of Excitability and Bursting," Neuroscience, MIT Press, 2005 (210 pages).
Kiss et al., "Emerging Coherence in a Population of Chemical Oscillators," Science, 296(5573): 1676-1678 (2002).
Kiss et al., "Predicting Mutual Entrainment of Oscillators with Experiment-Based Phase Models," Physical Review Letters, 94(24): 248301-1 to 248301-4 (2005).
Kiss et al., "Engineering Complex Dynamical Structures: Sequential Patterns and Desynchronization," Science, 316 (5833): 1886-1889 (2007).
Kobzar et al., "Pattern Pulses: Design of Arbitary Excitation Profiles as a Function of Pulse Aamplitude and Offset," J. Magnetic Resonance, 173(2): 229-235 (2005).
Koper, M.T.M., "The Theory of Electrochemical Instabilities," Electrochimica Acta, 37(10): 1771-1778 (1992).
Kori et al., "Synchronization Engineering: Theoretical Framework and Application to Dynamical Clustering," CHAOS, 18(2): 026111-1 to -13 (2008).
Kuramoto, Y. "Chemical Oscillations, Waves, and Turbulence," Springer, New York, 1984.
Kurths et al., "Synchronization: A Universal Concept in Non-linear Science," Cambridge University Press (2001).
Leloup et al., "Toward a Detailed Computational Model for the Mammalian Circadian Clock," PNAS USA, 100(12): 7051-7056 (2003).
Li et al., "Control of Inhomogeneous Quantum Ensembles," Physical Review A, 73: 030302-1 to 030302-4, (2006).
Li et al., "Control and Synchronization of Neuron Ensembles," IEEE Transactions on Automatic Control, 58(8): 1919-1930 (2013).
Moehlis et al., "Optimal Inputs for Phase Models of Spiking Neurons," J. Computational and Nonlinear Dynamics, 1(4): 358-367 (2006).
Nakao et al., "Phase-Reduction Approach to Synchronization of Spatiotemporal Rhythms in Reaction-Diffusion Systems," Physical Review X, 4(2): 021032-1 to 021032-23 (2014).
Orosz, G. "Decomposition of Nonlinear Delayed Networks Around Cluster States with Applications to Neurodynamics," SIAM J. Applied Dynamical Systems, 13(4): 1353-1386 (2014).
Pikovsky et al., "Synchronization: A Universal Concept in Non-linear Sciences," Cambridge University Press, NY, 2001 (430 pages).
Reinkensmeyer et al., "Tools for Understanding and Optimizing Robotic Gait Training," J. Rehabilitation Research & Development, 43(5): 657-670 (2006).
Rosenblum et al., "Controlling Synchronization in an Ensemble of Globally Coupled Oscillators," Physical Review Letters, 92(11): 114102-1 to 114102-4 (2004).
Sepulchre et al., "Stabilization of Planar Collective Motion: All-to-All Communication," IEEE Transactions on Automatic Control, 52(5): 811-824 (2007).
Strogatz, S.H. "Human Sleep and Circadian Rhythms: A Simple Model Based on Two Coupled Oscillators," J. Mathematical Biology, 25(3): 327-347 (1987).
Strogatz, S. H., "From Kuramoto to Crawford: Exploring the Onset of Synchronization in Populations of Coupled Oscillators," Physica D, 143(1-4): 1-20 (2000).
Strogatz, S. Editor, "Nonlinear Dynamics and Chaos: With Applications to Physics, Biology, Chemistry, and Engineering," 2nd Edition, Westview Press, Table of Contents only, 6 pages, (2001).
Tass, P.A. "A Model of Desynchronizing Deep Brain Stimulation with a Demand-Controlled Coordinated Reset of Neural Subpopulations," Biological Cybernetics, 89(2): 81-88 (2003).

* cited by examiner

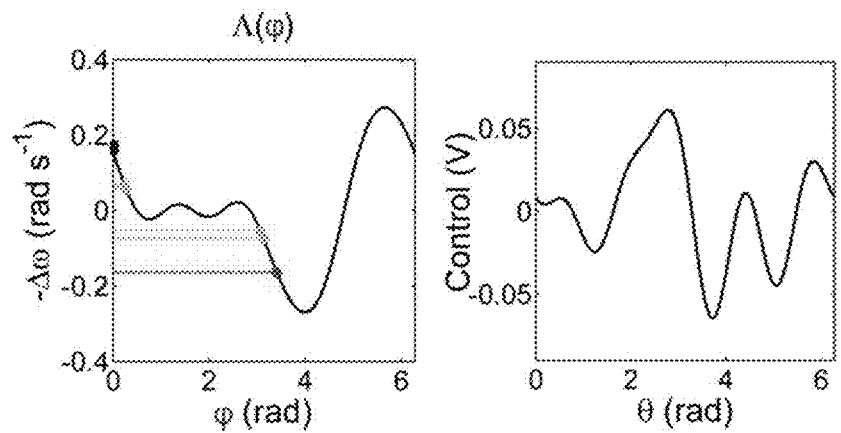
FIG. 2A    FIG. 2B
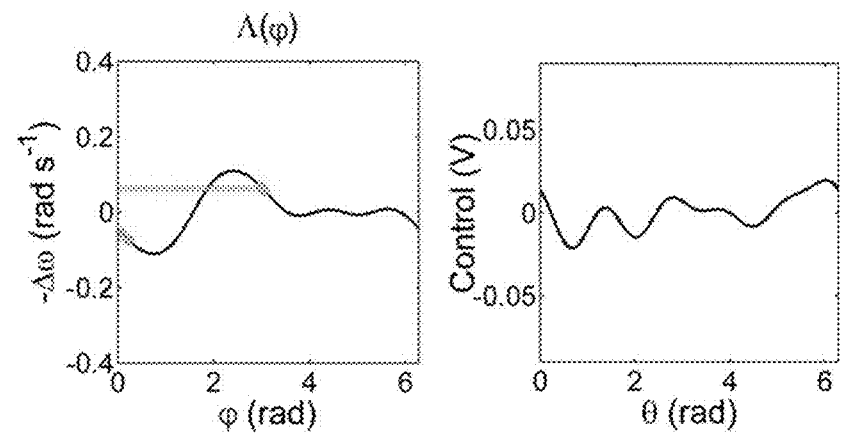
FIG. 2C    FIG. 2D
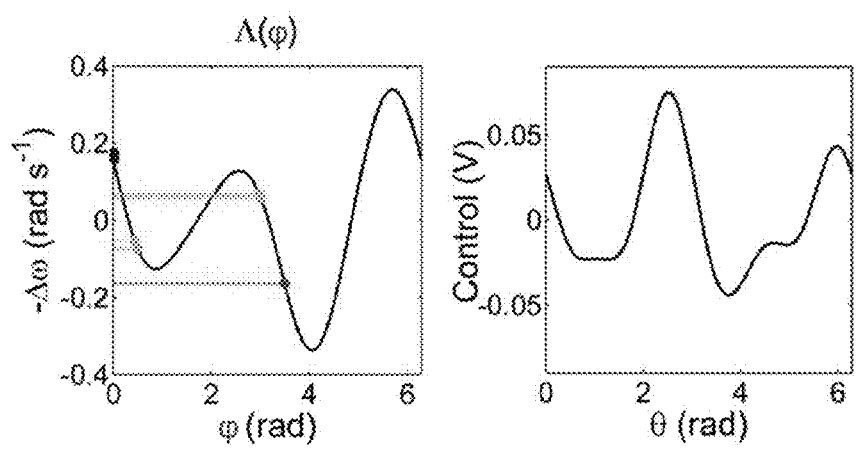
FIG. 2E    FIG. 2F

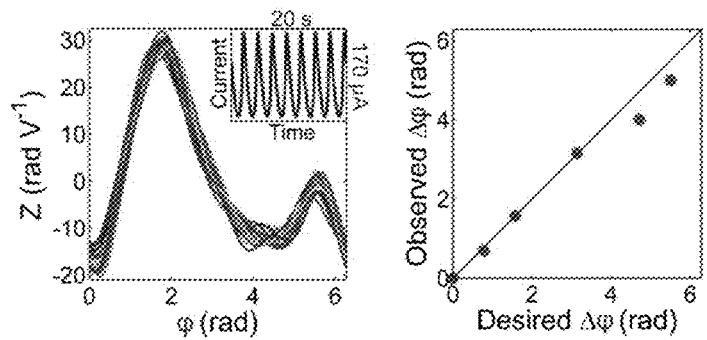
FIG. 3A    FIG. 3B
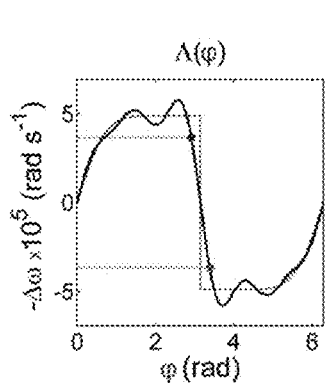 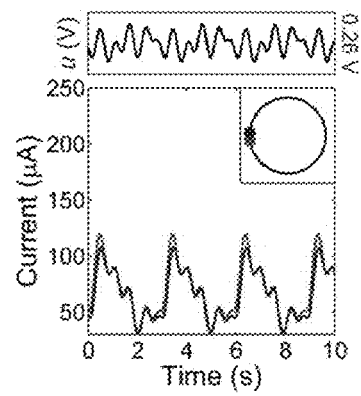
FIG. 3C    FIG. 3D
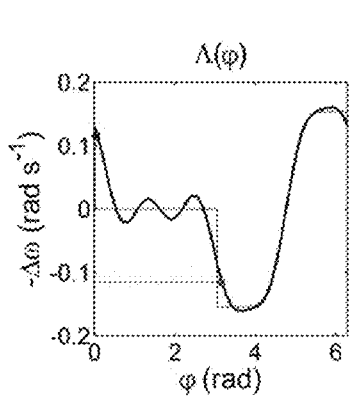 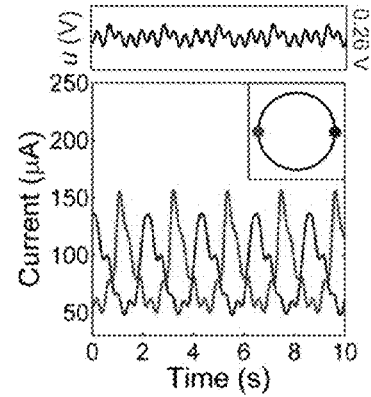
FIG. 3E    FIG. 3F

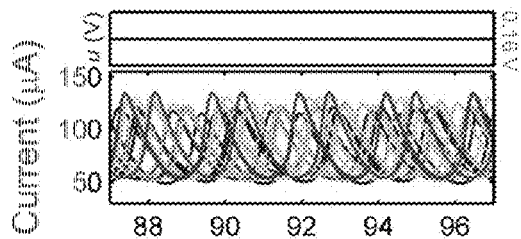 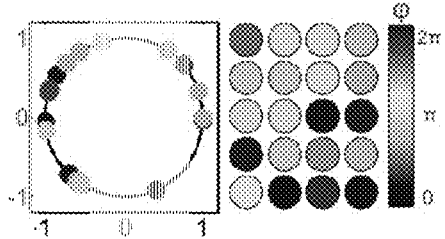
FIG. 6A  FIG. 6B  FIG. 6C
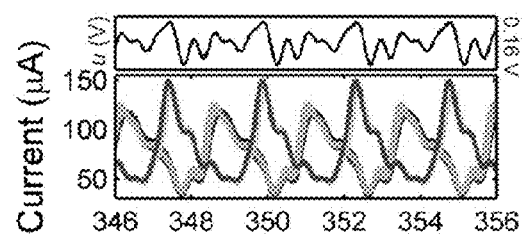 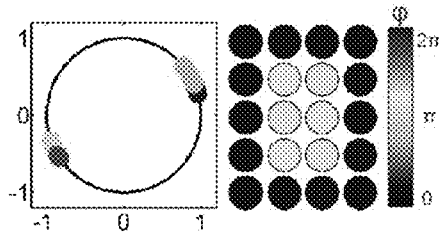
FIG. 6D  FIG. 6E  FIG. 6F
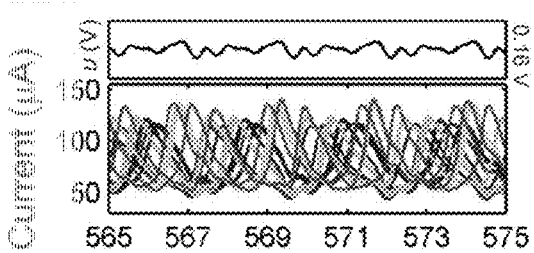 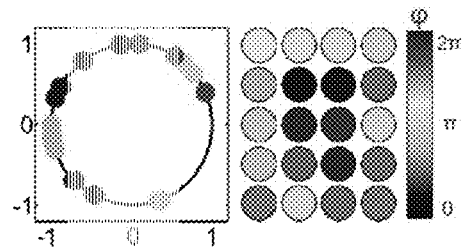
FIG. 6G  FIG. 6H  FIG. 6I

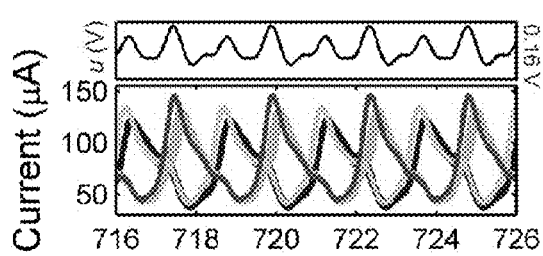 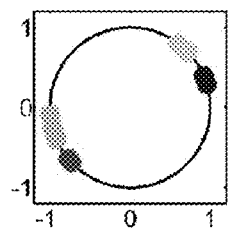 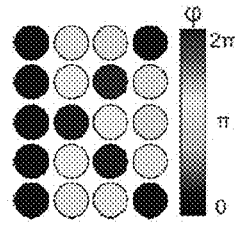
FIG. 6J  FIG. 6K  FIG. 6L
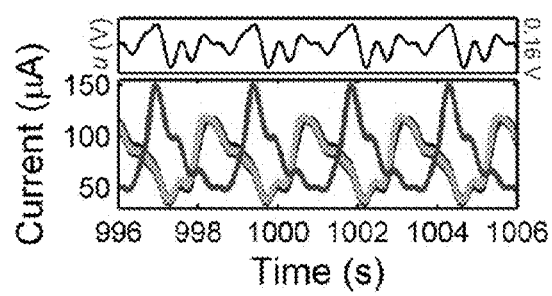 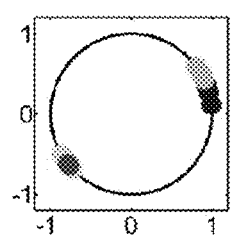 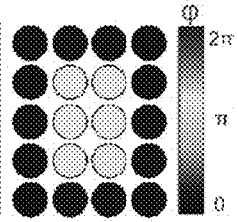
FIG. 6M  FIG. 6N  FIG. 6O

PHASE-SELECTIVE ENTRAINMENT OF NONLINEAR OSCILLATOR ENSEMBLES

CROSS-REFERENCE TO RELATED APPLICATIONS

This application claims the benefit of U.S. Provisional Application No. 62/296,421 filed on Feb. 17, 2016, the contents of which are incorporated herein by reference in their entirety.

STATEMENT REGARDING FEDERALLY SPONSORED RESEARCH & DEVELOPMENT

This invention was made with government support under grants CMMI-1301148, ECCS-1509342, and CMMI-1462796 awarded by the National Science Foundation. The government has certain rights to the invention.

BACKGROUND OF THE INVENTION

The ability to organize and finely manipulate the hierarchy and timing of dynamic processes is important for understanding and influencing brain functions, sleep and metabolic cycles, and many other natural phenomena. However, establishing spatiotemporal structures in biological oscillator ensembles is a challenging task that requires controlling large collections of complex nonlinear dynamical units. A method is presented to design entrainment signals that create stable phase patterns in ensembles of heterogeneous nonlinear oscillators without using state feedback information. This approach is demonstrated using experiments with electrochemical reactions on multi-electrode arrays, in which ensemble subgroups are selectively assigned into spatiotemporal patterns with multiple phase clusters. The experimentally confirmed mechanism elucidates the connection between the phases and natural frequencies of a collection of dynamical elements, the spatial and temporal information that is encoded within this ensemble, and how external signals can be used to retrieve this information.

Complex interactions among nonlinear periodic phenomena emerge in many natural and engineered systems. Numerous instances appear in chemical reactions and biological systems, which exhibit endogenous and emergent multi-scale oscillation. There is significant interest in characterizing synchronization in oscillators interconnected in networks, which is especially important for understanding the highly complex dynamics of man-made systems such as electric power grid, and elucidating the functions of neural systems. Understanding entrainment of oscillating systems to an exogenous forcing signal is crucial to modeling circadian timekeeping, dynamic neural regulation, and for the design of synchronizing or desynchronizing treatments of cardiac arrhythmias, Parkinson's disease, epilepsy, and movement disorders.

Even the simplest models of interacting oscillators can exhibit highly complex behavior, and individual oscillating units may themselves possess complicated dynamics. These factors are aggravated in practice by model and parameter uncertainty and the impracticality of obtaining feedback information, such as for in vivo biological applications, and pose challenges to manipulating or controlling oscillating ensembles. Such tasks require tractable yet accurate simplifications of the complex dynamic interactions involved, and demand suitable mathematical approaches that characterize ensemble-level properties while withstanding experimental uncertainties.

Control-theoretic techniques have been applied to control a single oscillator. In contrast, finely manipulating individual sub-systems in under-actuated ensembles, such as thousands of neurons in the brain affected by one electrode, rather than activating them homogeneously, remains a fundamental challenge. Synchronization has been engineered in collections of oscillators using feedback, or tuning coupling strengths. Such approaches require certain coupling structures, exact model specification, state feedback information, or precise knowledge of initial conditions, but still are not able to produce a prescribed phase pattern corresponding to frequency clusters of the oscillators.

Versatile open-loop control techniques were developed for simultaneous control of ensembles of quantum spin systems, which motivated the field of ensemble control. Inspired by selective pulse design in nuclear magnetic resonance (NMR), which enabled revolutionary applications including functional magnetic resonance imaging (fMRI), a method is developed for selectively manipulating the sub-units of oscillator ensembles using periodic inputs that are robust to parameter uncertainty and disturbances. Specifically, the method exploits the slight heterogeneity and high nonlinearity of an ensemble of structurally similar oscillators far past the Hopf bifurcation, rather than relying on a known coupling structure, state feedback, or initial condition information.

BRIEF DESCRIPTION OF THE INVENTION

In one aspect, a system for entraining an oscillator ensemble that includes a plurality of oscillators in an entrained phase pattern is provided. The system includes an entrainment device operatively coupled to each non-linear oscillator of the oscillator ensemble. The entrainment control device is configured to deliver a $2\pi$-periodic control signal $v(\theta)$ to all oscillators of the plurality of oscillators. Each $2\pi$-periodic control signal $v(\theta)$ is configured to detune each natural frequency $\omega_j$ of each oscillator by a frequency shift $\Delta\omega_j$ and to shift each natural phase $\psi_j$ of each oscillator by a phase offset $\varphi_j$. The frequency shift $\Delta\omega_j$ is a difference between the natural frequency $\omega_j$ and an entrained frequency $\Omega$. The phase offset $\varphi_j$ is a difference between the natural phase $\psi_j$ and an entrained phase $\theta$. Each oscillator of the plurality of oscillators is one of N non-linear oscillators endogenously oscillating at the natural frequency $\omega_j$ with the corresponding natural phase $\psi_j$. The index j ranges from 1 to N and each of the N non-linear oscillators is structurally similar. The entrained phase pattern is specified by a $2\pi$-periodic interaction function $\Lambda_\nu$ defining a relationship between a frequency shift $\Delta\omega$ and a phase offset $\varphi$ for all oscillators in the plurality of oscillators. The $2\pi$-periodic control signal $v(\theta)$ is specified using the $2\pi$-periodic interaction function $\Lambda_\nu$ and a phase response curve $Z(\theta)$ characterizing a phase shift of each oscillator in response to a weak perturbation of each oscillator. The entrained phase pattern includes a plurality of phase offsets $\varphi_j$, and each phase offset $\varphi_j$ corresponds to one oscillator of the plurality of oscillators.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The figures described herein below illustrate various aspects of the disclosure.

FIG. 2A is a graph illustrating an interaction function used to generate a control waveform to produce an "O" pattern in an ensemble of heterogeneous oscillators according to one aspect.

FIG. 2B is a graph illustrating a control waveform produced using the interaction function illustrated in FIG. 2A.

FIG. 2C is a graph illustrating an interaction function used to generate a control waveform to produce a precursor pattern in an ensemble of heterogeneous oscillators according to one aspect.

FIG. 2D is a graph illustrating a control waveform produced using the interaction function illustrated in FIG. 2C.

FIG. 2E is a graph illustrating an interaction function used to generate a control waveform to produce a "K" pattern in an ensemble of heterogeneous oscillators according to one aspect.

FIG. 2F is a graph illustrating a control waveform produced using the interaction function illustrated in FIG. 2E.

FIG. 3A is a graph showing phase response curves (PRCs) measured simultaneously for twenty working electrodes, and an inset graph showing observed current oscillations for the twenty working electrodes measured from the electrochemical cell and associated circuitry illustrated in FIG. 1.

FIG. 3B is graph showing the experimentally measured phase differences for the twenty working electrodes measured in FIG. 3A as a function of the corresponding desired phase differences.

FIG. 3C is a graph showing an ideal interaction function (dotted-line) and a respective best achievable approximation (solid-line) used to construct an in-phase assignment for two nonidentical electrode oscillators from the electrochemical cell and associated circuitry illustrated in FIG. 1.

FIG. 3D contains an upper graph showing a periodic control signal used to entrain the two nonidentical electrode oscillators in an in-phase pattern corresponding to the interaction function shown in FIG. 3C, and a lower graph showing a time-series of the output current measured from the two nonidentical electrode oscillators entrained in-phase: $(\phi_1^*, \phi_2^*)=(\pi,\pi)$, with natural frequencies $(\omega_1, \omega_2)=(0.330, 0.348)$ Hz, and $\Omega=0.339$ Hz with each oscillator response shown in blue and red; an inset graph shows the entrained in-phase oscillator phases on a unit circle.

FIG. 3E is a graph showing an ideal interaction function (dotted-line) and a respective best achievable approximation (solid-line) used to construct an anti-phase assignment for two nonidentical electrode oscillators from the electrochemical cell and associated circuitry illustrated in FIG. 1.

FIG. 3F contains an upper graph showing a periodic control signal used to entrain the two nonidentical electrode oscillators in an anti-phase pattern corresponding to the interaction function shown in FIG. 3E, and a lower graph showing a time-series of the output current measured from the two nonidentical electrode oscillators entrained anti-phase: $(\phi_1^*, \phi_2^*)=(0,\pi)$, with natural frequencies $(\omega_1,\omega_2)=(0.443,0.480)$ Hz, and $\Omega=0.462$ Hz with each oscillator response shown in blue and red; an inset graph shows the entrained in-phase oscillator phases on a unit circle.

FIG. 6A contains a lower graph showing the current oscillations measured from the electrochemical cell and associated circuitry shown in FIG. 1, and an upper graph showing the control signal used to obtain the current oscillations; no control signal was applied to the four electrode clusters $(N_1;N_2;N_3;N_4)=(7;7;3;3)$ with natural frequencies of $(\omega_1,\omega_2,\omega_3,\omega_4)=(0.390,0.406,0.427,0.442)$ Hz.

FIG. 6B contains a graph showing the phase pattern corresponding to the measured current oscillations shown in FIG. 6A at time $t_s=92$ sec, as projected on to a unit circle.

FIG. 6C contains a graph showing a map of the phase pattern corresponding to the measured current oscillations shown in FIG. 6A at time $t_s=92$ sec.

FIG. 6D contains a lower graph showing the current oscillations measured from the electrochemical cell and associated circuitry shown in FIG. 1, and an upper graph showing the forcing control signal at $\Omega=0.408$ Hz used to obtain the current oscillations shown in the lower graph corresponding to an "O" distribution pattern characterized by $(\phi_1^*,\phi_2^*,\phi_3^*,\phi_4^*)=(0,0,\pi,\pi)$.

FIG. 6E contains a graph showing the phase assignment corresponding to the "O" phase distribution pattern shown in FIG. 6D at time $t_s=351$ sec, as projected on to a unit circle.

FIG. 6F contains a graph showing a map of the "O" phase distribution pattern corresponding to the measured current oscillations shown in FIG. 6D at time $t_s=351$ sec.

FIG. 6G contains a lower graph showing the current oscillations measured from the electrochemical cell and associated circuitry shown in FIG. 1, and an upper graph showing the forcing control signal at $\Omega=0.408$ Hz used to obtain the current oscillations shown in the lower graph corresponding to a precursor to a "K" phase distribution pattern characterized by $(\phi_2^*,\phi_3^*)=(\pi,0)$.

FIG. 6H contains a graph showing the phase assignment corresponding to the precursor to a "K" phase distribution pattern shown in FIG. 6G at time $t_s=570$ sec, as projected on to a unit circle.

FIG. 6I contains a graph showing a map of the precursor to the "K" phase distribution pattern shown in FIG. 6G at time $t_s=570$ sec.

FIG. 6J contains a lower graph showing the current oscillations measured from the electrochemical cell and associated circuitry shown in FIG. 1, and an upper graph showing the forcing control signal at $\Omega=0.408$ Hz used to obtain the current oscillations shown in the lower graph corresponding to a "K" phase distribution pattern characterized by $(\phi_1^*,\phi_2^*,\phi_3^*,\phi_4^*)=(0,\pi,0,\pi)$.

FIG. 6K contains a graph showing the phase assignment corresponding to the "K" phase distribution pattern shown in FIG. 6J at time $t_s=721$ sec, as projected on to a unit circle.

FIG. 6L contains a graph showing a map of the "K" phase distribution pattern shown in FIG. 6J at time $t_s=721$ sec.

FIG. 6M contains a lower graph showing the current oscillations measured from the electrochemical cell and associated circuitry shown in FIG. 1, and an upper graph showing the forcing control signal at $\Omega=0.408$ Hz used to obtain the current oscillations shown in the lower graph corresponding to a second "O" phase distribution pattern characterized by $(\phi_1^*,\phi_2^*,\phi_3^*,\phi_4^*)=(0,0,\pi,\pi)$.

FIG. 6N contains a graph showing the phase assignment corresponding to the second "O" phase distribution pattern shown in FIG. 6M at time $t_s=1001$ sec, as projected on to a unit circle.

FIG. 6O contains a graph showing a map of the second "O" phase distribution pattern corresponding to the measured current oscillations shown in FIG. 6D at time $t_s=1001$ sec.

DETAILED DESCRIPTION OF THE INVENTION

Figure 1:
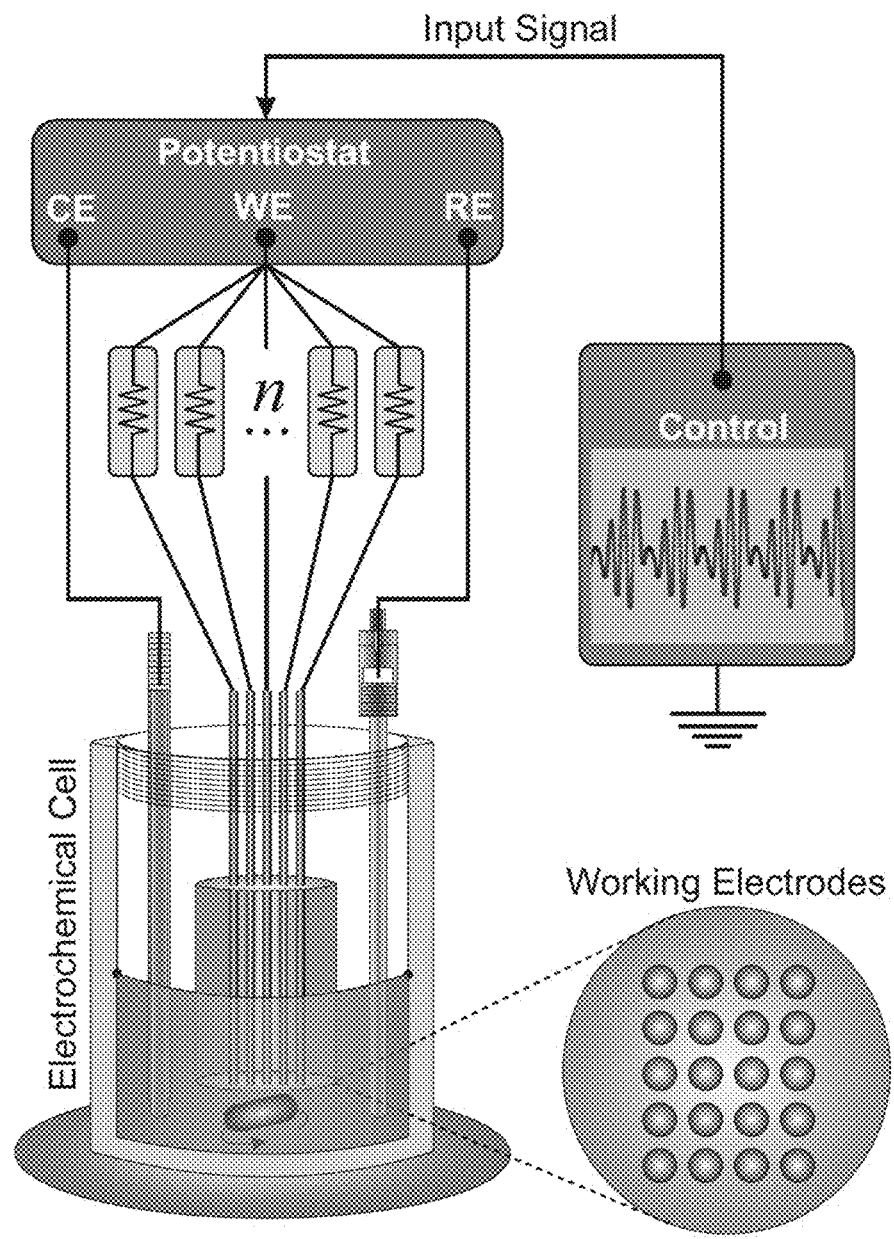
FIG. 1 is a schematic illustration showing an electrochemical cell and associated circuitry used to demonstrate control of a phase structure of an ensemble of heterogeneous oscillators.

A methodology is presented for constructing weak, globally-applied, open-loop control inputs that synchronize a collection of structurally similar yet heterogeneous nonlinear oscillators while selectively assigning their relative phases on the periodic orbit. Using the technique, the synchronization structure of an oscillating ensemble can be manipulated among diverse phase patterns, seen in relative positions on the limit cycle. A theory is developed specifically to overcome the challenges of experimental implementation when feedback information is unavailable, initial conditions are unknown, and the oscillators are subject to uncertainty in subsystem parameters and stochastic disturbances. The control inputs create and maintain such phase patterns when the coupling between oscillators is weak, while preserving the intrinsic nature of the ensemble to enable nondestructive application to fragile biological and chemical systems. The dynamics of the oscillators may be arbitrary, as long as all are structurally similar and exhibit sufficient nonlinear relaxation for the control design to be realizable. A coherent structure may be established and robustly maintained indefinitely by a single periodic waveform, which can be altered to switch between patterns. The theoretical methodology is demonstrated in practice with experiments to control complex electrochemical ensembles whose dynamics are variable and unknown, and for which state information is unavailable.

External stimuli that alter neuronal spiking activities are designed. Practically applicable techniques have been derived to control dynamic structures, such as synchrony or clustering, in a population of neurons in the brain.

The developed method can, among other things, be (1) used for the advancement of the neurostimulation technology for the treatment of neurological disorders, such as Parkinson's disease and epilepsy; (2) adopted to design neurocomputing architectures.

A. Phase Model Approximation

The effect of inputs on periodic dynamical systems may be approximated using phase models which can be computed for systems with known dynamics or experimentally inferred in practice when the dynamics are unknown. These models are used to characterize circadian cycles, cardiac rhythms, and phenomena in neural and chemical systems, and their simplicity has enabled control design for neuron models given initial conditions and exact parameters. Control techniques have recently been developed for individual nonlinear oscillators and finite collections described by phase models that require exactly known initial conditions, parameters, and dynamics. Many studies on synchronization focus on the network structure of couplings between oscillators, and the nonlinearity in the phase response of each unit is simplified to sinusoidal couplings with its neighbors. However, for the manipulation and desynchronization of electrochemical and neural systems, complex, hierarchical interactions must be established or broken in large collections of nonlinear systems. The dynamics, parameters, and interconnections of these systems are typically problematic to infer, may be noisy, variable, or uncertain, and state observations may be incomplete or unavailable. Such conditions elude tractable formulation, and require an approach where synchronization properties of the systems, i.e., asymptotic phase structure, are manipulated rather than steering the system states directly.

B. Entrainment of an Ensemble

Our method relies on entrainment, which refers to the dynamic synchronization of oscillating systems to periodic inputs. Each system in an ensemble of N structurally similar units exhibits endogenous oscillation along an attractive periodic orbit with period $T_j$, and is represented by the Winfree phase model $$\dot{\psi}_j = \omega_j + Z(\psi_j)u \tag{1}$$

where $\omega_j = 2\pi/T_j$ is the natural frequency and Z is the phase response curve (PRC), which quantifies how a weak perturbation u advances or delays the phase $\psi_j$. A value of $\psi_j = 0$ (equivalently $2\pi$) corresponds to a measurement of the $j^{th}$ system reaching its maximum.

i) Phase Coordinate Transformation

The technique for phase coordinate transformation stems from the early work of Andronov and Vitt, and can be derived directly from the method of Malkin. An oscillator is formally defined as a system of smooth ordinary differential equations $$\dot{x} = f(x, u), x(0) = x_0, t \in [0, \infty) \tag{1x}$$

where $x(t) \in \mathbb{R}^n$ is the state and $u(t) \in \mathbb{R}$ is a control function. The oscillatory property of equation (1x) implies the existence of an attractive, non-constant limit cycle $\gamma(t) = \gamma(t+T)$ which is a solution to the unperturbed system $\dot{\gamma} = f(\gamma, 0)$, on the periodic orbit defined by $\Gamma = \{\gamma \in \mathbb{R}^n : y = \gamma(t) \text{ for } 0 \leq t < T\} \subset \mathbb{R}^n$. The key idea is to define a mapping between $\gamma(t)$ to $\psi(t)$ in a way such that the phase of the unperturbed system advances proportionally to time along the periodic orbit, i.e., $\psi(t) = \omega t$, where $\omega = 2\pi/T$ is the natural frequency of oscillation for the unforced oscillator. The dynamics equation (1) can then be approximated in phase coordinates by a scalar equation $$\dot{\psi} = \omega + Z(\psi)u, \tag{2x}$$

which is called a phase model, where Z is the phase response curve (PRC), also called the infinitesimal PRC or iPRC, which quantifies the asymptotic phase shift due to an infinitesimal perturbative input applied at a given phase on the limit cycle. The phase variable $\psi(t)$ is associated to the isochronous manifold corresponding to $\gamma(t) \in \Gamma$, from which all undisturbed trajectories asymptotically synchronize. $\psi(t)=0 \pmod{2\pi}$ when an observed variable in the state vector $y=\gamma(t)$ attains its maximum on $\Gamma$. The phase model equation (2x) accurately represents the dynamics equation (1x) for sufficiently weak inputs $u(t)$ such that the solution $x(t, x_0, u)$ to equation (1x) remains within a small enough neighborhood of $\Gamma$. The PRC for a system with known dynamics of the form in equation (1x) can be computed by various procedures, including an approach similar to that of Malkin that is described in Appendix C of Malkin.

Phase selective entrainment techniques are developed using experiments in which nickel electrodes undergo anodic dissolution in sulfuric acid and exhibit electrochemical oscillations, for which the experimental apparatus is described in Section IV A. Prior to these experiments, the PRCs of the ensemble elements, which are shown FIG. 2A, were estimated and averaged for use as the nominal PRC in equation (1). This was done using a pulse perturbation procedure for system identification that was previously used for electrochemical oscillators, described below.

To synchronize oscillation of ensemble elements, each subsystem receives the same weak, periodic forcing input of frequency $\Omega$ of the form $u(t)v(\Omega t)$, where v is $2\pi$-periodic. When the forcing frequency is near the natural frequencies in the ensemble, averaging theory states that the mean difference $\varphi_j$ between each phase $\psi_j$ and the forcing phase $\theta = \Omega t$ follows the time-independent dynamic equation $$\dot{\varphi}_j = \Delta\omega_j + \Lambda_v(\varphi_j) \qquad (2)$$

where $\Delta\omega_j = \omega_j - \Omega$ is called the frequency detuning, and $$\Lambda_v(\varphi) = \frac{1}{2\pi}\int_0^{2\pi} Z(\theta+\varphi)v(\theta)d\theta \qquad (3)$$

is a $2\pi$-periodic interaction function that characterizes the average effect of the periodic input on the oscillation phase. Such ergodic averaging is discussed in more detail herein below and illustrated in FIG. 7. If equation (2) has a unique attractive fixed point $\varphi_j^*$ that satisfies $\Delta\omega_j + \Lambda_v(\varphi_j^*) = 0$, then the phase of the $j^{th}$ oscillator becomes entrained to the forcing phase $\theta$ with an average offset of $\varphi_j^*$. This analysis is widely applied to determine the interaction function resulting from a measured PRC and an input waveform, and equation (2) is used to infer the entrained system's stability. This approach is reversed by choosing the desired asymptotic behavior, constructing a suitable interaction function, and using the PRC to obtain the input by circular deconvolution of equation (3).

C. Interaction Functions for Phase Selection

The input $v(\Omega t)$ is designed so each system in equation (1) is entrained to a forcing frequency $\Omega$, e.g., the mean of natural frequencies $\omega_1 < \omega_2 < \ldots < \omega_N$, and such that the $j^{th}$ oscillator cycles its orbit with a phase offset of $\varphi_j^*$; relative to the forcing phase $\theta$. The set of pairs $(\omega_j, \varphi_j^*)$ constitutes a pattern for selective entrainment. It is required that $\dot{\varphi}_j = \Delta\omega_j + \Lambda_v(\varphi_j^*) = 0$ eventually holds for each oscillator, i.e., equation (2) has an attractive fixed point at $\varphi_j^*$ for all j at which the slope of the interaction function $\Lambda_v$ is negative. The function that best satisfies these ideal conditions has steep decreases at phase values $\varphi_j^*$ where entrainment must occur, and crosses (from above) horizontal lines at frequency detuning values $-\Delta\omega_j$. This creates the desired attractive fixed points for equation (2). Because the interaction function is periodic, it must then increase so that $\Lambda_v(2\pi) = \Lambda_v(0)$ holds. Crossings of $-\Delta\omega_j$ from below are unstable fixed points, and do not affect convergence.

The concept is illustrated in FIG. 6A, FIG. 6B, FIG. 6C, FIG. 6D, FIG. 6E, FIG. 6F, FIG. 6G, FIG. 6H, FIG. 6I, FIG. 6J, FIG. 6K, FIG. 6L, FIG. 6M, FIG. 6N, and FIG. 6O, which describe an experiment where a phase difference $\Delta\varphi^* = \varphi_2^* - \varphi_1^*$ is assigned between two entrained oscillators. In-phase synchronization at phase offsets of $(\varphi_1^*, \varphi_2^*) = (\pi, \pi)$ were desired, so the ideal interaction function has one steep decrease at $\varphi_1^* = \varphi_2^* = \pi$ that intersects horizontal lines through $-\Delta\omega_1$ (blue) and $-\Delta\omega_2$ (red) at it radians. FIG. 6D illustrates anti-phase synchronization with $(\varphi_1^*, \varphi_2^*) = (0, \pi)$, where the interaction function has two steep decreases at $\varphi_1^* = 0$ and $\varphi_2^* = \pi$ that intersect horizontal lines at $-\Delta\omega_1$ (blue) and $-\Delta\omega_2$ (red), respectively. The best achievable interaction function (solid line) and the PRC estimate yield the input from equation (3). The right columns of FIG. 3D and FIG. 3F show the observed current of two oscillators entrained in in-phase and anti-phase arrangements by the input waveform (shown above). These configurations are achieved regardless of initial oscillator phases, because the interaction function crosses the line $-\Delta\omega_j$ only once from above, so each system has a globally attractive fixed point. For the electrochemical system, phase differences in nearly the entire 0 to $2\pi$ region are achievable, with small deviations as $\Delta\varphi^*$ approaches $2\pi$, as seen in FIG. 3C.

D. Separation of Oscillator Ensembles into Phase Clusters

Figure 4A:
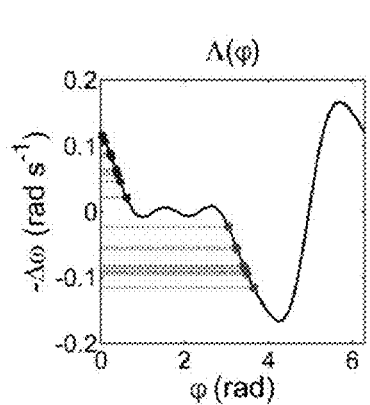
FIG. 4A is a graph showing an interaction function and the intersections of each phase offset $\phi_j^*$ with the interaction function for a phase assignment of an oscillator ensemble $(N_1.N_2)=(10. 10)$ including cluster 1 (blue) with $(\varphi_1=0$ and $\omega_1=0.450$ Hz as well as cluster 2 (red) with $\varphi_2=\pi$ and $\omega_2=0.471$ Hz. both clusters were forced at $\Omega=0.463$ Hz.
Figure 4B:
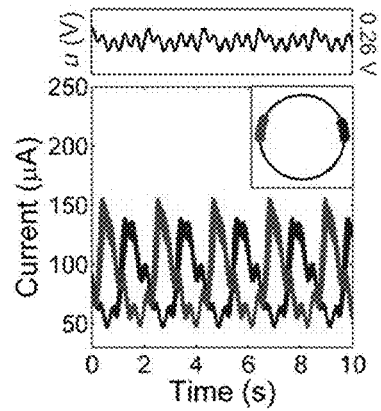
FIG. 4B includes a lower graph showing an entrained time-series corresponding to the phase assignment illustrated in FIG. 4A, an upper graph showing a periodic waveform of a control signal used to produce the phase assignment illustrated in FIG. 4A, and an inset graph showing the phase offsets projected onto a unit circle.
Figure 4C:
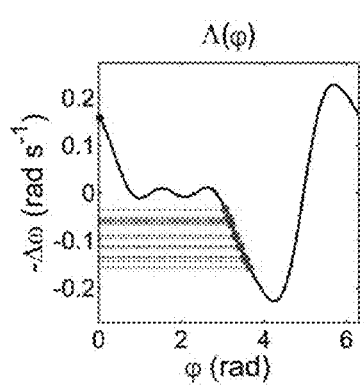
FIG. 4C is a graph showing an interaction function and the intersections of each phase offset $\phi_j^*$ with the interaction function for a phase assignment of an oscillator ensemble $(N_1.N_2)=(1. 19)$ including electrode 1 (blue) with $\varphi_1=0$ and $\omega_1=0.419$ Hz as well as cluster 2 (red) with $\omega_2=\pi$ and $\omega_2=0.454$ Hz. both clusters were forced at $\Omega=0.450$ Hz.
Figure 4D:
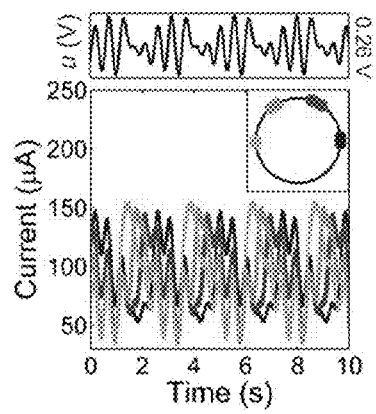
FIG. 4D includes a lower graph showing an entrained time-series corresponding to the phase assignment illustrated in FIG. 4C, an upper graph showing a periodic waveform of a control signal used to produce the phase assignment illustrated in FIG. 4C, and an inset graph showing the phase offsets projected onto a unit circle.
Figure 4E:
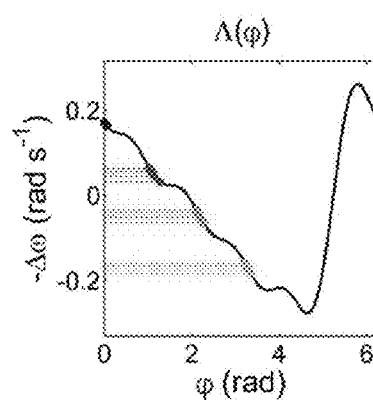
FIG. 4E is a graph showing an interaction function and the intersections of each phase offset $\phi_j^*$ with the interaction function for a phase assignment of an oscillator ensemble $(N_1.N_2.N_3.N_4)=(4.4.4.4)$ including cluster 1 (blue) with $\varphi_1=0$ and $\omega_1=0.386$ Hz, cluster 2 (red) with $\varphi_2=1.1$ rad and $\omega_2=0.404$ Hz, cluster 3 (green) with $\varphi_3=2.1$ rad and $\omega_3=0.421$ Hz, and cluster 4 (yellow) with $\varphi_4=\pi$ and $\omega_4=0.440$ Hz. all clusters were forced at $\Omega=0.413$ Hz.
Figure 4F:
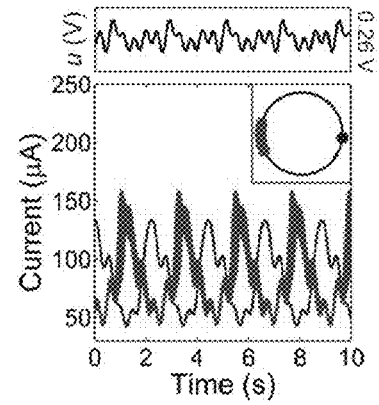
FIG. 4F includes a lower graph showing an entrained time-series corresponding to the phase assignment illustrated in FIG. 4E, an upper graph showing a periodic waveform of a control signal used to produce the phase assignment illustrated in FIG. 4C, and an inset graph showing the phase offsets projected onto a unit circle.

Uniquely attractive phase patterns are desired, where a common input synchronizes the oscillators to a pattern independently of their initial phases. The fixed point $\varphi_j^*$ of equation (2) must be unique for each j, which is achieved when the interaction function crosses each horizontal line $\Delta\omega_j$ from above only once at $\varphi_j^*$. This is possible when the phase offsets are monotonically ordered as $\varphi_1^* < \varphi_2^* < \ldots < \varphi_N^*$, for $\omega_1 < \omega_2 < \ldots < \omega_N$, as demonstrated by segregation of twenty inhomogeneous electrochemical oscillators into clusters in the experiments described in FIG. 4A, FIG. 4B, FIG. 4C, FIG. 4D, FIG. 4E, and FIG. 4F. An anti-phase configuration $(\varphi_1, \varphi_1) = (0, \pi)$ is achieved for electrodes in balanced $(N_1, N_2) = (10, 10)$ and unbalanced $(N_1, N_2) = (1, 19)$ clusters in FIG. 4A and FIG. 4C, respectively. In these two-cluster examples, the interaction function decreases in two steps, of which the top and bottom correspond to clusters with slower (blue) and faster (red) natural frequencies. FIG. 4E shows the formation of four balanced clusters of $(N_1, N_2, N_3, N_4) = (5, 5, 5, 5)$ oscillators with the phase structure $(\varphi_1^*, \varphi_2^*, \varphi_3^*, \varphi_4^*) = (0, 1.1, 2.1, \pi)$ radians. The phase offsets $\varphi_j^*$ are increasing as $-\Delta\omega_j$ decreases (and $\omega_j$ increases), and the designed interaction function decreases monotonically as it crosses the required intersections. Observe that the assumption of a common PRC is reasonable, because the functions in FIG. 2A are very similar, yet the oscillator frequencies are sufficiently heterogeneous for the technique to create the patterns in FIG. 4A, FIG. 4B, FIG. 4C, FIG. 4D, FIG. 4E, and FIG. 4F.

E. Control of Pattern Transitions in an Ensemble

Figure 5A:
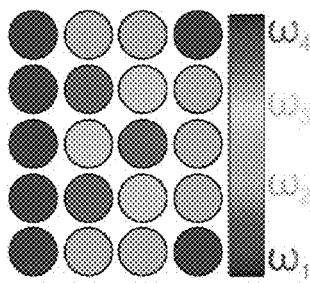
FIG. 5A is a color map showing the natural frequencies for four spatially distributed oscillator clusters associated with the electrochemical cell and associated circuitry shown in FIG. 1, in which the clusters have a size distribution of $(N_1.N_2.N_3.N_4)=(7.7.3.3)$ as arranged by natural frequency in ascending order $(\omega_1<\omega_2<\omega_3<\omega_4)$. Cluster 1 contains electrodes 1-7 (blue), cluster 2 contains electrodes 8-14 (cyan), cluster 3 contains electrodes 15-17 (yellow), and cluster 4 contains electrodes 18-20 (red).
Figure 5B:
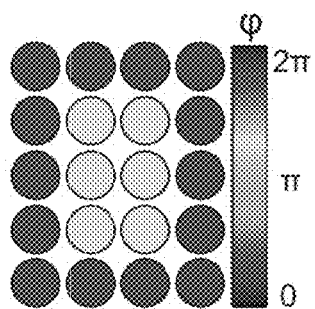
FIG. 5B is a color map showing a snapshot phase assignment of the four spatially distributed oscillator clusters shown in FIG. 5A at a forcing phase $\theta=0$ and corresponding to an "O" pattern, in which $(\varphi_1^*,\varphi_2^*,\varphi_3^*,\varphi_4^*)=(0,0, \pi, \pi)$.
Figure 5C:
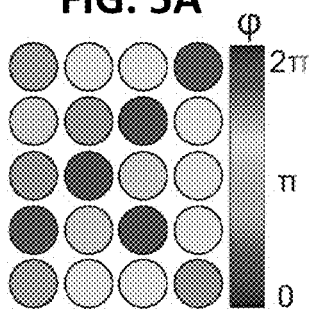
FIG. 5C is a color map showing a snapshot phase assignment of the four spatially distributed oscillator clusters shown in FIG. 5A at a forcing phase $\theta=0$ and corresponding to a precursor of a "K" pattern, in which $(\varphi_2^*,\varphi_3^*)=(\pi,0)$.
Figure 5D:
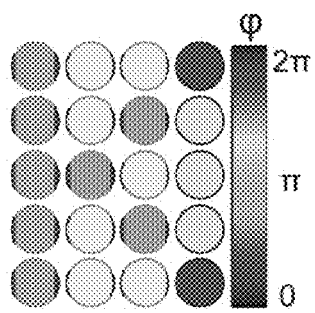
FIG. 5D is a color map showing a snapshot phase assignment of the four spatially distributed oscillator clusters shown in FIG. 5A at a forcing phase $\theta=0$ and corresponding to a "K" pattern, in which $(\varphi_1^*,\varphi_2^*,\varphi_3^*,\varphi_4^*)=(0,\pi,0,\pi)$.
Figure 5E:
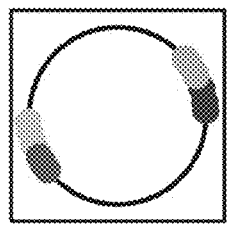
FIG. 5E is a graph showing the "O" phase assignment pattern shown in FIG. 5B projected onto a unit circle.
Figure 5F:
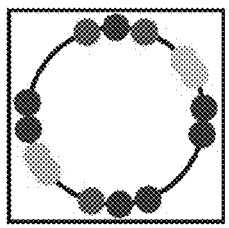
FIG. 5F is a graph showing the precursor of the "K" pattern phase assignment pattern shown in FIG. 5C projected onto a unit circle.
Figure 5G:
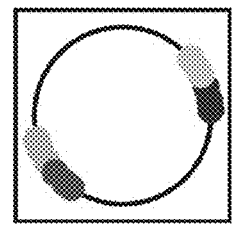
FIG. 5G is a graph showing the "K" pattern phase assignment pattern shown in FIG. 5D projected onto a unit circle.
Figure 5H:
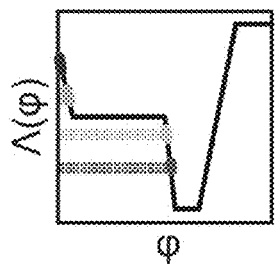
FIG. 5H is a graph showing an interaction function corresponding to the "O" phase assignment pattern shown in FIG. 5B.
Figure 5I:
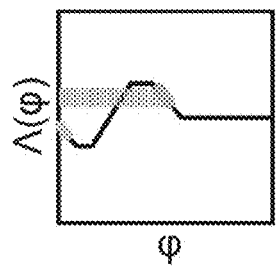
FIG. 5I is a graph showing an interaction function corresponding to the precursor of the "K" pattern phase assignment pattern shown in FIG. 5C.

Additionally, patterns were established without monotone phase ordering by designing an interaction function of the form at the bottom of FIG. 5I, which crosses a horizontal line at $-\Delta\omega_j$ from above twice, yielding multiple possible entrained phases and dependence on initial conditions. Precursor waveforms are applied to steer subsets of the ensemble into attractive regions for the desired phase offsets $\varphi_j^*$, then finalize and hold the pattern with an ultimate input.

Figure 5J:
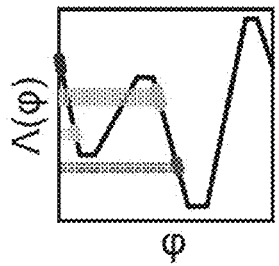
FIG. 5J is a graph showing an interaction function corresponding to the "K" pattern phase assignment pattern shown in FIG. 5D.

This procedure is applied to steer an ensemble between spatially associated clusters by alternating selective inputs. FIG. 5A, FIG. 5B, FIG. 5C, FIG. 5D, FIG. 5E, FIG. 5F, FIG. 5G, FIG. 5H, FIG. 5I, and FIG. 5J illustrates input design for itinerant formation of letters in the word "OK" in the array of 20 electrochemical oscillators used in the experiments in FIG. 4A, FIG. 4B, FIG. 4C, FIG. 4D, FIG. 4E, and FIG. 4F. Anti-phase assignment between clusters are produced to display the letter "O", then switch the input to produce the letter "K". Rhythmic elements are assigned desired phase offsets of $\varphi_j^*=0$ or $\varphi_j^*=\pi$, which correspond to "on" (pattern) or "off" (background) states, respectively, that are visualized using a color scale where 0 ("on") is blue and it ("off") is yellow. Switching between two patterns is accomplished using four numbered clusters, where 1 is "on" for both, 2 switches from "on" to "off", 3 switches from "off" to "on", and 4 is always "off". Electrodes in clusters of $(N_1, N_2, N_3, N_4)=(7, 7, 3, 3)$ elements with mean natural frequencies $(\omega_1, \omega_2, \omega_3, \omega_4)=(0.390, 0.406, 0.427, 0.442)$ Hz are positioned in the spatial arrangement in FIG. 5A. FIG. 5B, FIG. 5C, and FIG. 5D show the spatial distribution of phase offsets, FIG. 5E, FIG. 5F, and FIG. 5G show the corresponding structures on the unit circle, and FIG. 5H, FIG. 5I, and FIG. 5J show corresponding sketches of ideal interaction functions.

The pattern "O", shown in FIG. 5B, is realized using the phases $(\varphi_1^*,\varphi_2^*,\varphi_3^*,\varphi_4^*)=(0,0,\pi,\pi)$, which are achieved by an interaction function as in FIG. 5H. The phases $(\varphi_1^*,\varphi_2^*,\varphi_3^*,\varphi_4^*)=(0,\pi,0,\pi)$ used for "K" are not monotonically ordered, so a precursor waveform is applied to generate globally attractive phase offsets $\varphi_2^*=\pi$ and $\varphi_3^*=0$ for clusters 2 and 3. This anti-phase pattern establishes initial conditions for the final input waveform, while clusters 1 and 4 lose their entrainment, as shown in FIG. 5F. FIG. 5J illustrates the design of the finalizing control for pattern "K", where the phase assignments for clusters 1 and 4 are globally attractive, as seen in FIG. 5G, while clusters 2 and 3 stay at phase offsets established in the precursor stage. The transition from pattern "K" back to "O" is accomplished by applying the initial control for the pattern in FIG. 5H. Additional descriptions are provided of interaction function construction, pattern realizability, design for monotonically ordered patterns, and precursor waveform engineering, described herein below.

Measurements of the "O→K→O" pattern switching experiment appear in FIG. 6A, FIG. 6B, FIG. 6C, FIG. 6D, FIG. 6E, FIG. 6F, FIG. 6G, FIG. 6H, FIG. 6I, FIG. 6J, FIG. 6K, FIG. 6L, FIG. 6M, FIG. 6N, and FIG. 6O. FIG. 6A shows current oscillations for the reaction units given zero input, when no pattern forms. When the controls (shown above the current) are applied, the ensemble is entrained within several cycles, selectively forming the patterns for "O", the precursor, and "K". These results are shown in FIG. 6G, FIG. 6J and FIG. 6M, and correspond to FIG. 5B, FIG. 5C and FIG. 5D, respectively. The ensemble is returned to pattern "O", as shown in FIG. 6I, to demonstrate switching. The automatically generated interaction functions and control waveforms are herein below.

III. Discussion

Phase-selective entrainment enables the use of a single global signal to robustly assign elements of a noisy nonlinear oscillator ensemble to specific phases without using coupling or feedback information. Control design using interaction functions simplifies the creation of complex synchronization patterns to drawing or automatically generating curves through sets of crossing points and computing the resulting controls with a simple formula, which is an accessible technique for experimentalists. Greater relaxation in the oscillation and ensemble heterogeneity increases pattern controllability, and performance is improved as the oscillations move farther away from the Hopf bifurcation. The asymptotic nature of entrainment yields robustness to noise, disturbances, and model parameter variability while preserving the intrinsic nature of the ensemble.

Such resilience is required for nondestructive control of under-actuated, noisy, and uncertain biological and chemical ensembles that cannot be readily observed. For example, an effective technology for neurological treatment of Parkinson's disease is provided by deep brain stimulation, which alleviates pathological synchronization in the brain. Selective entrainment could be extended to ensembles with weak coupling to design robust desynchronization inputs, which would potentially benefit noninvasive neurostimulation technology. The goal could be a target distribution that is found to be optimal for leveraging neuroplasticity to prevent resynchronization after the stimulus is ended. The technique could also improve phase regulation to treat cardiac arrhythmias and sleep irregularities. The formalism could also represent the entrainment that occurs in circadian timekeeping.

A simple sinusoidal forcing of the form $v(\Omega t)=\sin(\Omega t)$ results in a sinusoidal interaction function, because of orthogonality of the trigonometric Fourier basis. Sinusoidal forcing can thus be used to create monotone ordered phase patterns, and could also be used for desynchronization. However, because such an interaction function is decreasing on an interval of length $\pi$, the maximum achievable distance between external phase offsets $\varphi_1^*$ and $\varphi_N^*$, is $|\varphi_N^*-\varphi_1^*|<\pi$. Thus, a sinusoidal input cannot produce anti-phase synchronization. This approach enables more versatile manipulation of phase relationships beyond this limitation. The application to desynchronization is described herein below and FIG. 11, and quantify how this approach increases the achievable relative phase desynchronization difference over sinusoidal forcing. More rigorous mathematical characterization of ensemble desynchronization by periodic inputs is a compelling direction for further investigation.

The disclosed methodology takes advantage of approximations that are possible in the specific experimental setting. In the experiments described herein, the distribution of natural frequencies of ensemble oscillations varies by ±20% from the (non-zero) mean, the oscillators are very weakly coupled, the amplitude of the required external forcing signal is relatively small, and the entrainment process is approximated well by averaged phase models. In addition, although the ensemble subsystems are slightly heterogeneous and noisy, with variation in natural frequencies and dynamic properties, the phase response curves are very similar. The methodology is expected to function well in other experimental settings in which these conditions are satisfied. Moreover, the method holds promise for extension to other scenarios, e.g., in sub- and superhamornic entrainments (the oscillations are locked to different frequency ratios), where the interaction function based phase description is possible.

The arrangement of frequency clusters in an oscillator ensemble can also be viewed as encoding information within the spatial pattern produced when selective entrainment is applied. One of several encoded messages can then be retrieved using the phase-selective entrainment process, for which the passkey for retrieving the message is the temporal information contained in a periodic input signal. The passkey is constructed using the PRC and natural frequencies of the dynamical subsystems, and after that input signal is applied, the spatial phase pattern produced in the ensemble reveals the message. This approach may be incorporated in neurocomputing architectures that mimic neural systems in nature. Future investigation is required to understand how network coupling could be suppressed or taken advantage of to improve pattern resilience and information capacity, or effectively encrypt the message by preventing estimation of PRCs and natural frequencies of oscillators in the spatial array.

ii. Model Identification for Oscillating Systems

Several approaches to model identification have been used to estimate the PRC in real oscillating systems subject to noise and disturbances. A technique is described for phase model identification, which has been applied previously in experiments on electrochemical systems. This model identification procedure does not require online state observations or feedback, but rather relies on post-processing of a pseudo-random input sequence and observations of the effect on a state variable. Suppose that a brief impulse of duration $\Delta t$ and magnitude M is applied to an oscillator at time $t_0$, when the phase is $\psi(t_0)$. Specifically, suppose $u(t)=M$ for $t \in [t_0, t_0+\Delta t]$, and $u(t)=0$ elsewhere. Let $\psi_1(t_0+NT)$ and $\psi_0(t_0+NT)$ represent the phase value when the oscillator has completed N cycles after the pulse is applied, and in the absence of a pulse, respectively. Because $\Gamma$ is strongly attractive, the system will relax back to the periodic orbit several cycles after the pulse is applied. Assuming that the pulse duration $\Delta t$ is brief, $Z(\psi(t))$ is approximately constant on $t \in [t_0, t_0+\Delta t]$, so that integrating equation (2x) results in $$\psi_0(t_0+NT)=\omega NT+\psi(t_0), \tag{3x}$$

$$\psi_1(t_0+NT)=\omega NT+\psi(t_0)+\int_{t_0}^{t_0+\Delta t} Z(\psi(t))Mdt \approx \omega NT + \psi(t_0)+Z(\psi(t_0))M\Delta t \tag{4x}$$

Subtracting equation (3) from equation (4) and solving for $Z(\psi(t_0))$ results in $$Z(\psi(t_0)) = \frac{\psi_1(t_0+NT)-\psi_0(t_0+NT)}{M\Delta t} \tag{5x}$$

The phases $\psi_0$ and $\psi_1$ are valued at 0 (equivalently $2\pi$) at peaks of the observed state variable, and their values between peaks are reasonably approximated by linear interpolation. If $y(t)$ is the observed oscillator output, let $T_{-1}$ and $T_N$ denote the latest time at which $y(t)$ reaches a peak before time $t_0$ and the time when $y(t)$ reaches the $N^{th}$ peak after the pulse is applied. Because phase on the limit cycle is linearly proportional to time, i.e., $\psi(t)=\omega t$, the phases at two distinct time points $t_1, t_2 \in [0, T)$ will satisfy $\psi(t_1)-\psi(t_2)=\omega \cdot (t_1-t_2)$. As a result, the linear interpolation yields:

$$\psi_1(t_0+NT)-\psi_0(t_0+NT) \approx \omega \cdot (T_N-T_{-1}) - \omega \cdot NT = \tag{6x}$$

$$2\pi \cdot \frac{(T_N-T_{-1})-NT}{T}$$

where N is greater than the sufficient number of limit cycles for the perturbed system $\psi_1$ to have relaxed to the periodic orbit $\Gamma$. In one implementation, a sequence of pulses is created at intervals of $T(N+r_j)$, where $r_j \in (0,1)$ are pseudo-random, so that post-processing results in a time series $Z(\psi_j)\psi_j=\psi_{j-1}+\omega T(N+r_j)(\text{mod } 2\pi)$. The pulse sequence is applied, and the measured peak times are used to estimate the phase differences in equation (6x) in a postprocessing step. The data are fitted using a Fourier series to estimate the PRC $Z(\psi)$. One important advantage of this approach is to enable the concurrent identification of the PRCs for a large ensemble of rhythmic systems with simultaneously measurable output by using a single globally applied pulse sequence applied to the entire ensemble. The measurement state variable signal for each oscillator can then subsequently be processed off-line to produce a collection of phase models. This procedure is used to estimate the PRCs of each electrochemical oscillator in an experimental array, which are shown in FIG. 2A of the main text.

iii) Ergodic Averaging for Oscillating Systems

The central mechanism of the disclosed control methodology is entrainment, which refers to the dynamic synchronization of an oscillating system to a periodic input. The properties that characterize entrainment of the system in equation (2x) to a periodic forcing control $u(t)=v(\Omega t)$, where $v$ is $2\pi$-periodic and $\Omega$ is the forcing frequency, are closely approximated by ergodic averaging when the forcing signal is weak, i.e., $v=\varepsilon v_1$ where $v_1$ has unit energy and $\varepsilon \ll 1$. Given such an input, the system in equation (1x) is guaranteed to remain in a neighborhood of $\Gamma$ in which the phase model in equation (2x) remains valid. A slow phase variable is defined by $\phi(t)=\psi(t)-\Omega t$, and the difference $\Delta \omega=\omega-\Omega$ is called the frequency detuning. The dynamic equation for the slow phase is then $$\dot{\phi}=\dot{\psi}-\Omega=\Delta\omega+Z(\Omega t+\phi)v(\Omega t), \tag{7x}$$

where $\dot{\phi}$ is called the phase drift. The asymptotic behavior of equation (7x) is obtained by ergodic averaging, which eliminates the explicit dependence on time on the right hand side. An averaging operator $\langle \cdot \rangle : \mathcal{P} \to \mathbb{R}$ is defined where $\mathcal{P}$ is the set of $2\pi$-periodic functions on $\mathbb{R}$, by $$\langle x \rangle = \frac{1}{2\pi} \int_0^{2\pi} x(\theta)d\theta. \tag{8x}$$

Then the weak ergodic theorem for measure-preserving dynamical systems on the torus implies that for any periodic function $v$, the interaction function $$\Lambda(\phi) \triangleq \langle Z(\theta+\phi)v(\theta) \rangle \tag{9x}$$

$$= \frac{1}{2\pi} \int_0^{2\pi} Z(\theta+\phi)v(\theta)d\theta$$

$$= \lim_{T \to \infty} \frac{1}{T} \int_0^T Z(\Omega t+\phi)v(\Omega t)dt$$

exists as a continuous, $2\pi$-periodic function in $\mathcal{P}$, where $\theta=\Omega t$ is called the forcing phase.

The formal averaging theorem permits us to approximate equation (7x) by the averaged system $$\dot{\varphi}=\Delta\omega+\Lambda_v(\varphi), \tag{10x}$$

in the sense that there exists a change of variables $\varphi=\phi+\varepsilon h(\varphi,\phi)$ that maps solutions of equation (7x) to those of equation (10x). Without being limited to any particular theory, it has been proved previously that this approximation is of order $\mathcal{O}(\varepsilon^2)$, and hence it is appropriate in the case of weak forcing ($v=\varepsilon v_1$ with $\varepsilon \ll 1$). The averaged equation (10x) is autonomous, and approximately characterizes the asymptotic behavior of the system in equation (2x) under periodic forcing. Specifically, the system is entrained by a control $u=v(\Omega t)$ when the phase drift equation (10x) satisfies $\dot\varphi=0$, which will occur as $t\to\infty$ if there exists a phase $\varphi^\infty$ that satisfies $\Delta\omega=\Lambda_v(\varphi^\infty)=0$. Conversely, when both the control waveform v and PRC Z are non-zero, the function $\Lambda_v(\varphi)$ is not identically zero, so when the system is entrained there exists at least one $\varphi^\infty \in [0, 2\pi)$ that is an attractive fixed point of equation (10x). Such stable fixed points $\{\varphi_i^\infty\}$ of equation (10x) are the roots of the equation $\Delta\omega+\Lambda_v(\varphi)=0$ that also satisfy $\Lambda_v'(\varphi)<0$, where $$\Lambda_v'(\varphi) = \frac{d}{d\varphi}\Lambda_v.$$

Figure 7:
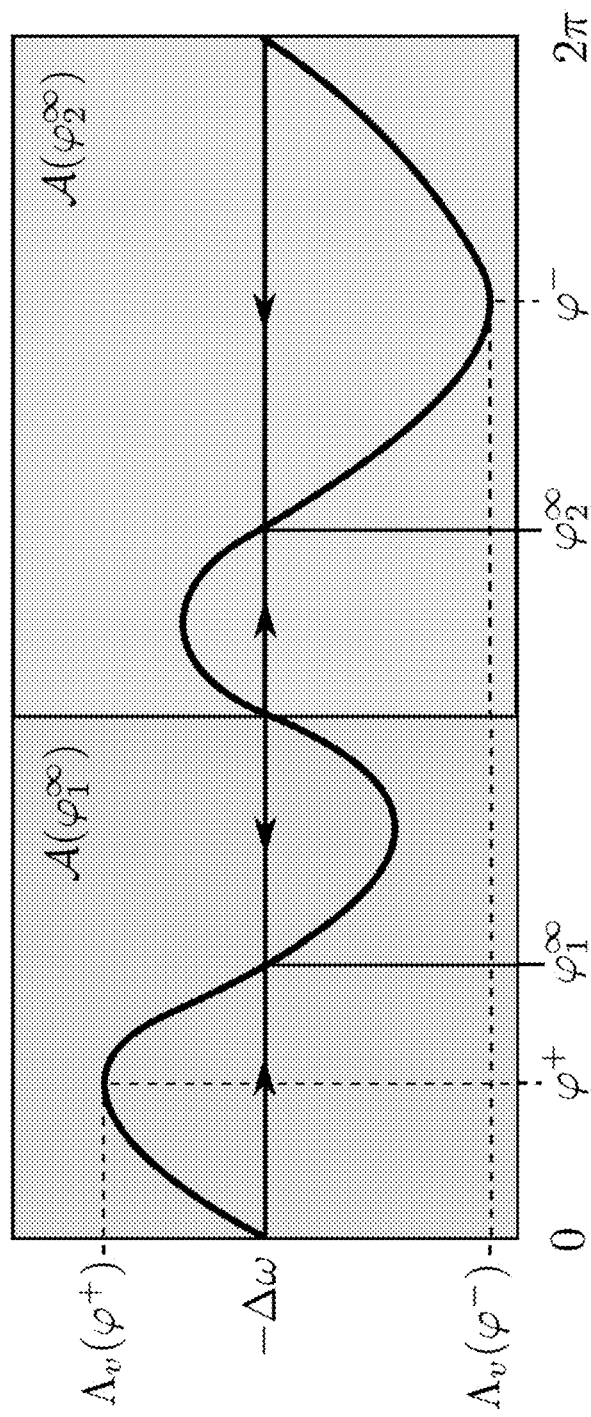
FIG. 7 is a graph showing several properties of an interaction function $\Lambda_\nu(\varphi)$; the maximum and minimum values $\Lambda_\nu(\varphi^+)$ and $\Lambda_\nu(\varphi^-)$, which occur at the phases $\varphi^+$ and $\varphi^-$, respectively, determine the range of frequency detuning for which the oscillator can be entrained using weak forcing. The solutions $\varphi_1^\infty$ and $\varphi_2^\infty$ of the equation $\Lambda_\nu(\varphi)=-\Delta\omega$ that satisfy $\Lambda'(\varphi)<0$ determine the average phase shift, relative to $\Omega t$, at which the oscillation stabilizes from a given initial phase. Initial phases in the regions $\mathcal{A}(\varphi_1^\infty)$ (grey) and $\mathcal{A}(\varphi_2^\infty)$ (green) result in asymptotic phase shifts of $\varphi_1^\infty$ and $\varphi_2^\infty$, respectively. When $\Lambda_\nu(\varphi)>-\Delta\omega$ then $\dot\varphi>0$ so the phase increases, and when $\Lambda_\nu(\varphi)<-\Delta\omega$ the $\dot\varphi<0$ so the phase decreases, as indicated by the arrows to illustrate equation (10)

The values $\{\varphi_i^\infty\}$ determine the average phase shift, relative to the forcing phase $\theta=\Omega t$, at which the oscillation stabilizes from an initial phase difference $\varphi(0)$. It is denoted by $\mathcal{A}(\varphi_i^\infty) \subset [0, 2\pi)$ that the set of initial phases $\varphi(0)$ that result in convergence of the oscillator to $\varphi_i^\infty$. In addition, the phases $\varphi^+ = \arg\max_\varphi \Lambda_v(\varphi)$ and $\varphi^- = \arg\min_\varphi \Lambda_v(\varphi)$ at which the interaction function achieves its maximum and minimum values, respectively, are defined. In order for entrainment to occur, $-\Lambda_v(\varphi^+) \le \Delta\omega \le -\Lambda_v(\varphi^-)$ must hold, so that at least one stable fixed point of $\Lambda_v$ exists. Thus the range of the interaction function determines which values of the frequency detuning $\Delta\omega$ yield phase locking, and the shape of $\Lambda_v$ determines the possible asymptotic phase shifts $\varphi_i^\infty$. These properties are illustrated in FIG. 7.

iv) Ensemble Interaction Function and Control Input Construction

The interaction function of a structurally similar ensemble is examined, and methods of constructing and processing the interaction function to create a control input with a desired phase selection effect is disclosed herein. The interaction function formalism is invoked to derive the long-run behavior of a collection of N nonlinear oscillators with phase-reduced dynamics of the form in equation (2x) given by $$\mathcal{F} = \{\dot\psi_j = \omega_j + Z(\psi_j)u, j=1,\ldots,N\} \quad (11x)$$

which all share an identical PRC. It is supposed, without loss of generality, that the natural frequencies of the ensemble elements are ordered according to $\omega_1 < \omega_2 < \ldots \omega_N$. If an input of the form $u=v(\Omega t)$, where v is $2\pi$-periodic, is applied to all the oscillators in $\mathcal{F}$, the collection of average phase drift dynamics of the form in equation (10x) is obtained as given by $$\langle\mathcal{F}\rangle = \{\dot\varphi_1 = \Delta\omega_j + \Lambda_v(\varphi_j), j=1,\ldots,N\}. \quad (12x)$$

If each average drift equation in $\langle\mathcal{F}\rangle$ has a fixed point, then the input waveform $v(\Omega t)$ entrains all of the oscillators in $\mathcal{F}$ to the frequency $\Omega$, and the pattern that emerges in the phase offsets $\varphi_j^\infty$ of the oscillators relative to the forcing phase $\theta=\Omega t$ can be inferred from the interaction function, the frequencies $\omega_j$, and the initial conditions $\varphi_j(0)$. Specifically, the average phase drift $\dot\varphi_j$ of each synchronized oscillator will be zero, and the average phase offset from the forcing phase $\theta=\Omega t$ will be $\varphi_{ij}^\infty$, depending on which set $\mathcal{A}(\varphi_{ij}^\infty)$ the initial phase $\varphi_j(0)$ belongs to. Here $\mathcal{A}_j(\varphi_{ij}^\infty)$ denotes the set of initial phases for which the $j^{th}$ oscillator of $\langle\mathcal{F}\rangle$ is attracted to the asymptotic phase offset $\varphi_{ij}^\infty$. When synchronization of the collection $\langle\mathcal{F}\rangle$ to the fixed points $\varphi_{ij}^\infty$ occurs, then $\dot\varphi_j = \Delta\omega_j + \Lambda_v(\varphi_j) = 0$ holds, with $$\Lambda_v(\varphi_{ij}^\infty) = -\Delta\omega_j, j=1,\ldots,N \quad (13x)$$

$$\Lambda_v'(\varphi_{ij}^\infty) < 0, j=1,\ldots,N, \quad (14x)$$

where $\varphi_{ij}^\infty$ is one of the possible asymptotic phases for the jth oscillator.

Figure 8:
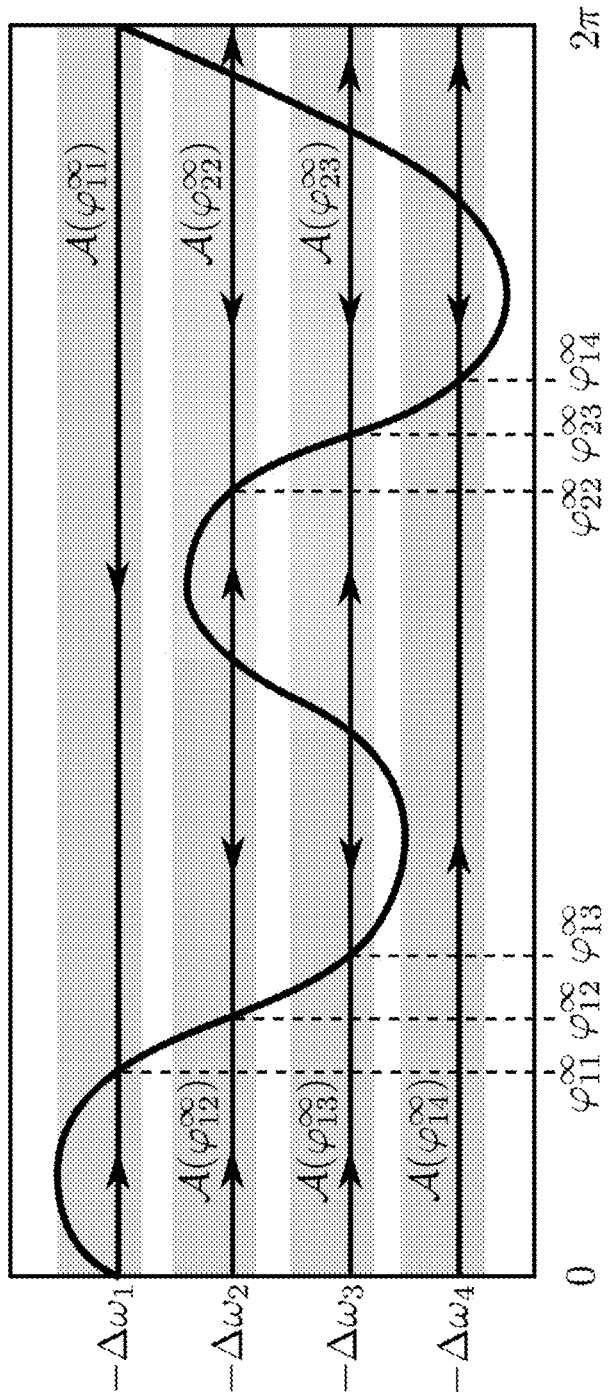
FIG. 8 is a graph showing an interaction function $\Lambda_\nu(\varphi)$ that satisfies the conditions (13)-(14) with $\varphi_{11}^\infty$ for j=1, $\varphi_{12}^\infty$ or $\varphi_{22}^\infty$ for j=2, $\varphi_{13}^\infty$ or $\varphi_{23}^\infty$ for j=3, and yon for j=4. The attractive regions $\mathcal{A}/(\varphi_{ij}^\infty)$ are indicated in grey for i=1 and green for i=2.

The condition in equation (14x) guarantees that the dynamical configuration is locally attractive and stable, as illustrated for an individual oscillator in FIG. 7. Conversely, if $\Lambda_v$ satisfies equations (13x)-(14x), and the initial phases of the oscillators in $\mathcal{F}$ satisfy $\psi_j(0) = \varphi_{ij}^\infty$ for $j=1,\ldots,N$, then the synchronization pattern will be maintained. The pattern is also established and maintained when the initial conditions are relaxed to $\psi_j(0) \in \mathcal{A}(\varphi_{ij}^\infty)$ for $j=1,\ldots,N$. These regions are illustrated for an example interaction function in FIG. 8. Note that for a given collection of entrained oscillators in equation (12x) the stable synchronization pattern may not be unique, but depends on the initial conditions $\psi_j(0)$ of the collection.

The above analysis describes how the interaction function between a forcing waveform v and the PRC Z common to the collection $\mathcal{F}$ characterizes the asymptotic phase structure of an oscillator ensemble with heterogeneous natural frequencies. The construction of ideal interaction functions for desired phase patterns is then examined, and the properties of the ensemble that determine their realizability. Because the $Z(\theta)$, $v(\theta)$, and $\theta_v(\varphi)$ are all $2\pi$-periodic, they may be expressed using Fourier series, and the Fourier series for $\Lambda_v(\varphi)$ is readily computed using equation (9x), trigonometric identities, and the orthogonality of the Fourier basis. The functions Z and v may be represented using the truncated series expansions $$Z(\theta) \approx Z^r(\theta) = \frac{a_0}{2} + \sum_{n=1}^{r}[a_n\cos(n\theta) + b_n\sin(n\theta)], \quad (15x)$$

$$v(\theta) \approx v^r(\theta) = \frac{c_0}{2} + \sum_{n=1}^{r}[c_n\cos(n\theta) + d_n\sin(n\theta)], \quad (16x)$$

where the appropriate order r will be discussed below. Applying trigonometric angle sum identities to equation (9) and the orthogonality of the Fourier basis to eliminate terms yields $$\Lambda_v^r(\varphi) = \frac{f_0}{2} + \frac{1}{2}\sum_{n=1}^{r}[f_n\cos(n\varphi) + g_n\sin(n\varphi)], \quad (17x)$$

$$f_0 = \frac{a_0 c_0}{2}, \quad (18x)$$

$$f_0 = a_n c_n + b_n d_n,$$

$$g_n = b_n c_n - a_n d_n.$$

Therefore given truncated Fourier series expansions $\Lambda_v^r(\theta)$ and $Z^r(\theta)$, the Fourier coefficients of the corresponding truncated series for the control waveform $v^r(\theta)$ are given by $$c_0 = 2\frac{f_0}{a_0}\chi_{[a_0 \ne 0]}, \quad (19x)$$

$$c_n = 2\frac{f_n a_n + b_n g_n}{a_n^2 + b_n^2}\chi_{[a_n^2+b_n^2 \ne 0]},$$

$$d_n = 2\frac{f_n b_n - a_n g_n}{a_n^2 + b_n^2}\chi_{[a_n^2+b_n^2 \ne 0]},$$

where $\chi_A = 1$ if A is true, and $\chi_A = 0$ otherwise.

An ideal interaction function $\Lambda_v(\varphi)$ that corresponds to the desired phase assignment task in equations (13x)-(14x) can be designed using a sum of scaled and shifted sigmoid functions. The error function is used, which is given by $$erf(x) = \frac{2}{\sqrt{\pi}} \int_0^x e^{-t^2} dt, \quad (20x)$$

as the basic element of the construction of the designed ideal interaction function that passes precisely through the coordinates $(\varphi_j^*, -\Delta\omega_j)$. A smooth approximation to the unit step function is first defined by $$\sigma(x) = \tfrac{1}{2}(erf(2x)+1), \quad (21x)$$

which satisfies $\sigma(-1) \approx 0$, $\sigma(1) \approx 1$, and $\sigma(0) = \tfrac{1}{2}$. The range points are then created, $$r_1 = -\Delta\omega_1 + \tfrac{1}{2}(-\Delta\omega_1 + -\Delta\omega_2) \quad (22x)$$

$$r_j = \tfrac{1}{2}(-\Delta\omega_j - \Delta\omega_{j-1}), j=2, \ldots, N \quad (23x)$$

$$r_{N+1} = -\Delta\omega_N + \tfrac{1}{2}(-\Delta\omega_{N-1} + \Delta\omega_N), \quad (24x)$$

as well as the domain points, $$s_1 = \tfrac{1}{2}(\varphi_1^* + \varphi_N^* - 2\pi), \quad (25x)$$

$$s_j = \tfrac{1}{2}(\varphi_j^* + \varphi_{j-1}^*), j=2, \ldots, N \quad (26x)$$

$$s_{N+1} = \tfrac{1}{2}(\varphi_1^* + \varphi_N^* + 2\pi), \quad (27x)$$

and the domain scaling factors $$h_1 = \min\{s_2 - \varphi_1^*, (\varphi_1^* - s_1)/2\}, \quad (28x)$$

$$h_j = \min\{s_{j+1} - \varphi_1^*, (\varphi_1^* - s_1)/2\}, j=2, \ldots N \quad (29x)$$

$$h_{N+1} = \min\{\tfrac{1}{2}(s_{N+1} - \varphi_N^*, \}. \quad (30x)$$

A suitable interaction function $\Lambda_\nu^*$ is then constructed by $$\Lambda_\nu^*(\varphi) = r_1 + (r_1 - r_{N+1})\sigma((\varphi - s_1)/h_{N+1}) + \quad (31x)$$

$$\sum_{j=2}^{N}(r_{j+1} - r_j)\sigma((\varphi - \varphi_j^*)/h_j) +$$

$$\sum_{j=2}^{N}(r_{j+1} + r_j)\sigma((\varphi + 2\pi - \varphi_j^*)/h_j) +$$

$$(r_1 - r_{N+1})\sigma((\varphi - s_{N+1})/h_{N+1}).$$

The function in equation (31x) will thus pass close to the phase and detuning pairs $(\varphi_j, -\Delta\omega_j)$. The sums in (31x) are repeated with the added offset factors $2\pi$ and $-2\pi$ because the sigmoid function (21x) is not a perfect Heaviside unit step, but a periodic interaction function $\Lambda_\nu^*$ must nevertheless be created. The particular methodology used to automatically create a suitable interaction function $\Lambda_\nu^*$ that approximately satisfies (13x)-(14x) is not crucial in itself.

As long as the designed interaction function satisfies these properties, the Fourier coefficients (19x) obtained by circular de-convolution of this interaction function $\Lambda_\nu^*$ and the nominal ensemble PRC Z yields the control that produces the desired phase pattern. Equations (20x)-(31x) are provided as a suggested example algorithm, which has been used for automatic control design for the experiments disclosed herein. A satisfactory interaction function curve $\Lambda_\nu^*$ may not be unique, and could be constructed using many different algorithms, and the need to satisfy (13x)-(14x) is the only common requirement. Control inputs may be designed indirectly by constructing an interaction function.

The resulting function $\Lambda_\nu^*$ is approximated by a truncated r-order Fourier series $\Lambda_\nu^r$ as in equation (17x), which is then used to compute the input waveform in equation (19x). The maximal order r is determined by the number of square amplitudes $\mathcal{A}_n^2$ of the Fourier series terms in the PRC that exceed a tolerance $\delta_Z$. In order for $\Lambda_\nu^r(\varphi)$ to satisfy the design conditions in equations (13x)-(14x), it must sufficiently well approximate $\Lambda_\nu(\varphi)$, and therefore the realizability of the design in equations (13x)-(14x) ultimately depends on the complexity of the PRC, in addition to the frequency distribution of the ensemble and the desired phase offsets. When these conditions are satisfied, the control waveform $v^r(\theta)$ that results in the desired phase pattern can be easily synthesized using the Fourier coefficient formula in equation (19x).

iv) Interaction Function Realizability

The nonlinear complexity of the common PRC of oscillating subsystems in an ensemble determines the realizability of a desired interaction function for the ensemble. Specifically, a greater number of significant terms in the Fourier series approximation of the PRC are obtained as the oscillation exhibits higher relaxational behavior. Typically, this occurs as the oscillation moves farther past a Hopf bifurcation.

By inspecting equation (19x), it is evident that $v^r(\theta)$ exists for a pair $\Lambda_\nu^r(\theta)$ and $Z^r(\theta)$ only if $a_n^2 + b_n^2 > 0$ for all n for which $f_n > 0$ or $g_n > 0$, and when $a_0 \neq 0$ if $f_0 \neq 0$. Therefore, any terms of the Fourier series for $\Lambda_\nu$ for which these conditions are not satisfied must be removed from the construction. For actual biological and chemical oscillating systems, the magnitudes $\mathcal{A}_n^2 = a_n^b + b_n^2$ decay approximately exponentially. It is thus crucial for the expansion order r to be appropriately chosen such that $\mathcal{A}_n^2 > \delta_Z$ for n≤r, where $\delta_Z$ is an appropriate tolerance, and any order n for which $\mathcal{A}_n = 0$ occurs must be omitted from the truncated series. This guarantees that numerical conditioning errors do not arise, and also that the designed $v^r(\theta)$ satisfies the weak forcing assumption. An appropriate empirical value for the tolerance is $\delta_Z = \langle Z^2 \rangle \cdot 10^{-4}$. Hence given the input $u(t) = v^r(\Omega t)$, the asymptotic configuration of the entrained oscillators of equation (12x) will approximately satisfy the conditions in equations (13x)-(14x).

For the experimental electrochemical oscillators described in the main text, the appropriate series truncation is r=5. This limits the types of phase patterns that can be achieved for ensembles of such oscillators, and in particular, explains why the observed and desired values of $\Delta\varphi$ in the parity diagram in FIG. 3C of the main text diverge near $\Delta\varphi = \tfrac{4}{5} \cdot 2\pi$. The interaction function must be decreasing at $\Lambda_\nu(\varphi_2^*) = -\Delta\omega_2$ then return and again decrease at $\Lambda_\nu(\varphi_1^*) = -\Delta\omega_1$. Because only 5 Fourier series terms can be used to synthesize $\Lambda_\nu$, the derivative $$\frac{d}{d\varphi}\Lambda_\nu(\varphi)$$

is limited when v has limited amplitude, so there is a minimum phase gap required for this return. This capacity for return of $\Lambda_\nu$ disappears as $\Delta\varphi$ approaches $2\pi$, as seen in the left panel of FIG. 3E of the main text.

The realizability of the interaction function in the above sense corresponds directly to realizability of a particular phase pattern in the ensemble. Thus, the existence of a periodic waveform that entrains an ensemble to such a phase pattern depends on the PRC of the ensemble sub-elements. In particular, a greater number of significant terms in the Fourier series expansion of Z corresponds to greater flexibility in phase pattern construction. Thus, more highly nonlinear and relaxational oscillation dynamics reflect greater controllability of the ensemble. Further work to more rigorously characterize this property of oscillatory ensembles is compelling.

v) Interaction Functions for Globally Attractive Patterns

A control input waveform is globally attractive for a phase pattern if frequency detuning values for the oscillators are monotone decreasing as desired phase offsets increase, and the corresponding interaction function can be realized. The natural frequencies of the ensemble $\mathcal{F}$ may be ordered according to $\omega_1 < \omega_2 < \ldots \omega_N$. Then the frequency detuning values in $\langle \mathcal{F} \rangle$ satisfy $-\Delta\omega_1 > -\Delta\omega_2 > \ldots \Delta\omega_N$. Suppose also that the desired phase assignment satisfies $\varphi_1^* < \varphi_2^* < \ldots \varphi_N^*$. Then an ideal interaction function that satisfies the appropriate conditions in equations (13x)-(14x) can be designed to have a unique set of asymptotic average phase offsets $\varphi_j^\infty = \varphi_j^*$; that are globally attractive, with $\mathcal{A}_j(\varphi_j^*) = [0, 2\pi)$. The desired interaction function is monotone decreasing for phases on $[\delta_1, \varphi_N^* + \delta_2] \pmod{2\pi}$ and monotone increasing on $(\varphi_N^* + \delta_2, 2\pi)$ to satisfy periodicity, where $\delta_1$ and $\delta_2$ are sufficient gaps for $$\frac{d}{d\varphi}\Lambda_v(\varphi)$$

to change sign. An example of such a $\Lambda_v$, which is of the same form as those used in experiments described herein previously is illustrated in FIG. 9.

Figure 9:
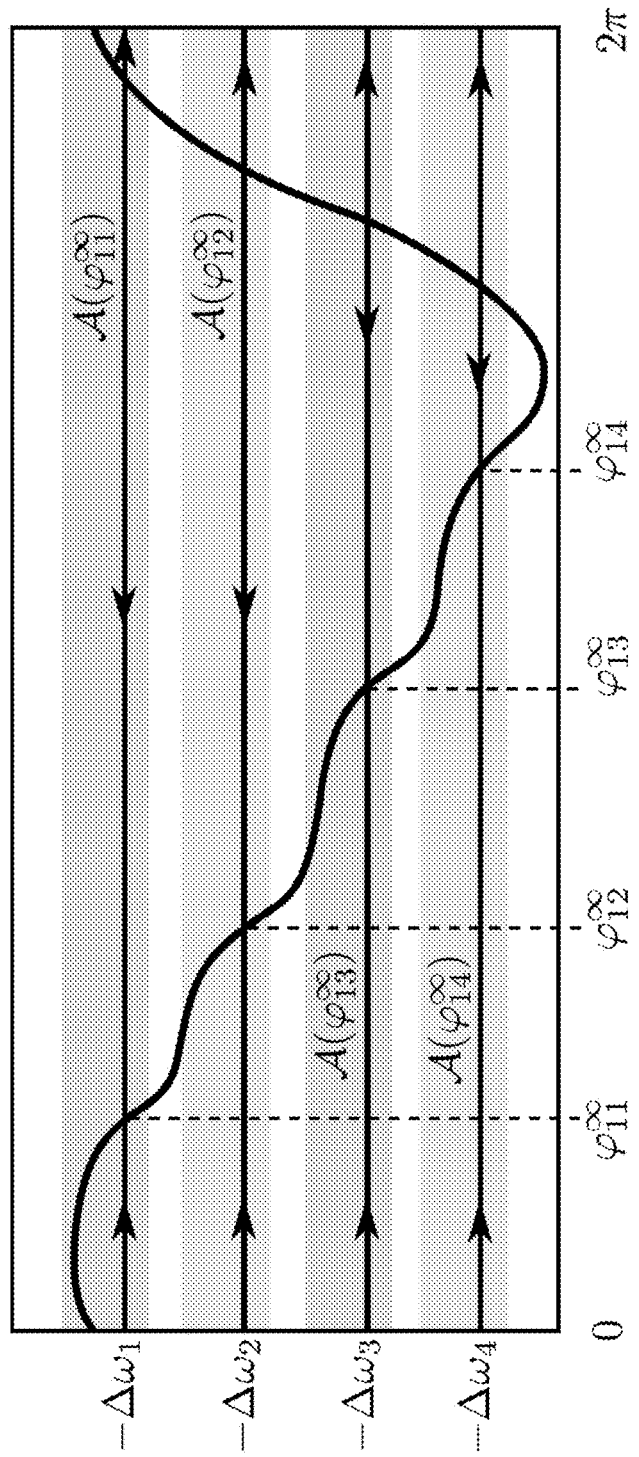
FIG. 9 is a graph showing an interaction function $\Lambda_\nu(\varphi)$ designed using the monotonicity method that satisfies the conditions in equations (13x)-(14x) with a globally attractive phase pattern. The unique fixed points for each oscillator are $(\varphi_{11}^\infty, \varphi_{22}^\infty, \varphi_{33}^\infty,$ and $\varphi_{44}^\infty$ for j=1; 2; 3; 4, respectively. The attractive regions are $A_j(\varphi_{1j}^\infty)=[0,2\pi)$ for all j, as indicated.

Application of the waveform v that produces the interaction function $\Lambda_v$ in FIG. 9 through the circular convolution in equation (9x) will asymptotically guide a rhythmic ensemble of four oscillators into a coherent phase configuration with phase offsets $\varphi_{11}^\infty$, $\varphi_{12}^\infty$, $\varphi_{13}^\infty$, and $\varphi_{14}^\infty$ for oscillators j=1, 2, 3, 4. In essence, the heterogeneity in natural frequencies $\omega_j$ and the nonlinearity in Z are leveraged to design a weak, low-amplitude waveform that achieves and maintains such a synchronization structure without altering the fundamental dynamics of individual rhythmic units. Monotone ordering of the assigned phases in the same order as natural frequencies allows the synthesis of an ideal interaction function that achieves the desired stable fixed-point average phases $\varphi_{1j}^\infty = \lim_{t \to \infty} \varphi_j(t) = \varphi_j^*$. Moreover, such a $\Lambda_v$ satisfies $\mathcal{A}_j(\varphi_j^*) = [0, 2\pi)$ for all j=1, ..., N so that the pattern will be established for any set of initial conditions Imo), so that the phase structure is globally attractive. Finally, suppose that the coefficients of the Fourier series of the PRC Z of the oscillators in $\mathcal{F}$ satisfy $\mathcal{A}_n^2 > \delta_Z = \langle Z^2 \rangle \cdot 10^{-4}$ for all n<N, so that the deconvolution of $\Lambda_v$ as given in equations (15x)-(19x) may be done using truncated series with r=N terms.

Precursor Waveforms for Non-Globally Attractive Patterns

Figure 10:
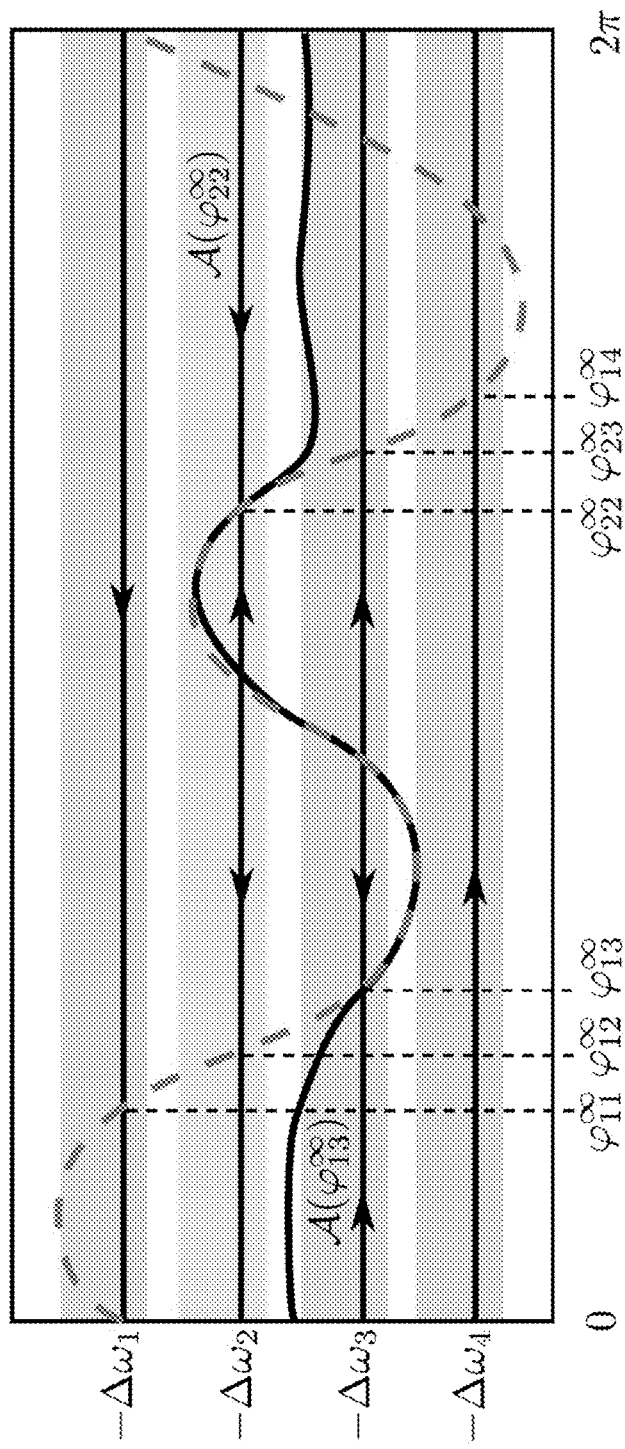
FIG. 10 is a graph showing an interaction function $\Lambda_\nu(\varphi)$ corresponding to a precursor input that entrains oscillators j=2 and 3 to the desired phase offsets $\varphi_2^*=\varphi_{22}^\infty$ and $\varphi_3^*=\varphi_{13}^\infty$. The attractive regions $A_2(\varphi_{22}^\infty)=[0,2\pi)$ and $A_3(\varphi_{12}^\infty)=[0,2\pi)$ are global. The waveform generated from the interaction function in FIG. 8 repeated here as an orange dashed line, can be subsequently applied to finalize the pattern.

If the desired phase pattern is not monotonically arranged in the sense described herein below, then a control waveform does not exist such that the pattern is globally attractive. In that case, a precursor waveform is required to bring the phases of ensemble elements into an arrangement after which an ultimate waveform is applied to finalize and hold the phase pattern. When the desired phase offsets $\varphi_j^*$ corresponding to natural frequencies $\omega_j$ are not uniformly increasing on $[0, 2\pi)$, a globally attractive phase structure cannot be achieved. In such cases, as the one illustrated in FIG. 8, one or more precursor inputs must be applied to steer subsets of the ensemble elements into the desired attractive regions $\mathcal{A}_j(\varphi_j^*)$, after which a final input is applied to finalize and subsequently hold the pattern. For the example in FIG. 8, a precursor waveform can be applied to entrain oscillators j=2 and 3 to designed phase offsets $\varphi_2^* = \varphi_{22}^\infty$ and $\varphi_3^* = \varphi_{13}^\infty$ as shown in FIG. 10. When this preliminary entrainment step is accomplished with respect to the chosen forcing phase, the control input is changed to the one corresponding to the $\Lambda_v$ for the full pattern in FIG. 8, which is outlined using a dashed line in FIG. 10 as well. This two-step procedure guarantees that the final outcome is the desired phase assignment, rather than one of several possible patterns. This is the situation that characterizes the experiment "O→K→O" as illustrated in FIG. 5A, FIG. 5B, FIG. 5C, FIG. 5D, FIG. 5E, FIG. 5F, FIG. 5G, FIG. 5H, FIG. 5I, and FIG. 5J and FIG. 6A, FIG. 6B, FIG. 6C, FIG. 6D, FIG. 6E, FIG. 6F, FIG. 6G, FIG. 6H, FIG. 6I, FIG. 6J, FIG. 6K, FIG. 6L, FIG. 6M, FIG. 6N, and FIG. 6O.

vii) Interaction Function for Desynchronization

Figure 11:
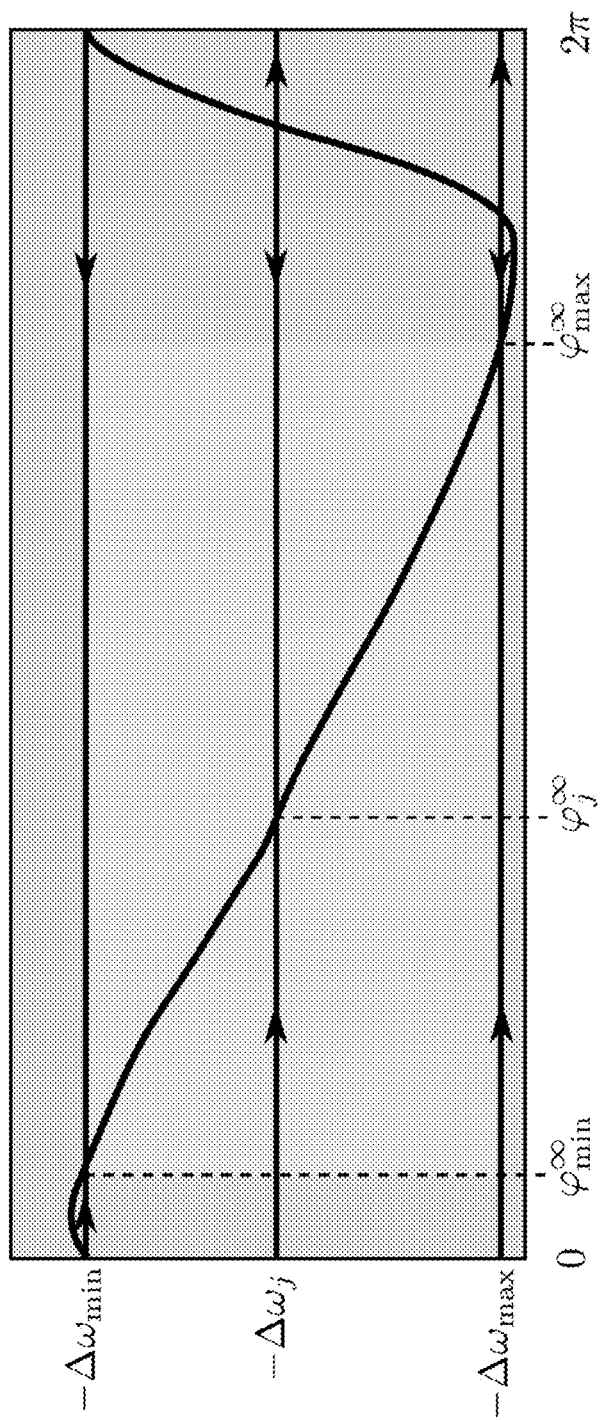
FIG. 11 is a graph showing an interaction function $\Lambda_\nu(\varphi)$ corresponding to desynchronization of a large ensemble of oscillators with frequencies distributed uniformly on the interval $[\omega_{min},\omega_{max}]$. The frequency detuning values are distributed uniformly on $[-\omega_{max},\omega_{min}]$, so that the control generated from $\Lambda_\nu(\varphi)$ will disperse the phase offsets uniformly on the interval $[\varphi_{min}^\infty, \varphi_{max}^\infty]$ The asymptotic offset $\varphi_j^\infty$ for an oscillator with an intermediate frequency $\omega_j\in[\omega_{min},\omega_{max}]$ is indicated.

Suppose it is wished to accomplish phase desynchronization of a very large ensemble of oscillators $\mathcal{F}$, where N is large but uncertain with the frequencies $\omega_j$ distributed uniformly on an interval $[\omega_{min}, \omega_{max}]$ The ideal interaction function $\Lambda_v$ corresponding to a waveform that will spread the phase offsets of the ensemble uniformly across a large domain is shown in FIG. 11. Note that because the interaction function satisfies the monotonicity property, the desynchronizing effect is global for any initial configuration of the ensemble. The Fourier series coefficients of the desynchronizing control waveform v are then obtained from the formula in equation (19x) for circular deconvolution from $\Lambda_v$. A natural continuation of the work on generation of coherent phase structures using global controls without feedback disclosed herein pertains to the effect of such controls on networks of weakly coupled oscillators. Specifically, in the presence of weak coupling, the averaged dynamic equation in (12x) for the $j^{th}$ oscillator becomes $\dot{\varphi}_j = \Delta\omega_j + \Lambda_v(\varphi_j) + \varepsilon \Sigma_i H_{ij}(\varphi_j - \varphi_i)$, where $H_{ij}$ characterizes the interaction between the $i^{th}$ and $j^{th}$ oscillators. If the coupling strength is weak relative to the interaction function $\Lambda_v$, i.e., $0 < \varepsilon \ll 1$, then the coupling terms will have little influence on the ability to construct phase patterns in the ensemble by external inputs. A mathematical problem is posed by characterizing the desynchronization action of this type of control and how it is affected as coupling strength c increases. A phase transition may occur after a critical coupling strength is reached after which the desynchronizing action is overpowered by synchronization due to coupling. As a result, a continued investigation in the direction of effectively desynchronizing entrainment controls that account for couplings and topology is warranted. In the context of affecting pathologically synchronized neuronal ensembles, progress in this direction will have particularly important implications for research and clinical neuroscience applications.

Consider that a simple sinusoidal forcing of the form $v(\Omega t) = \sin(\Omega t)$ can be used to desynchronize the ensemble with phase offsets on $[0, \pi)$. This is because it results in an interaction function that decreasing on an interval of length $\pi$ so the maximum phase difference achievable is $|\varphi_{max}^\infty - \varphi_{min}^\infty| < \pi$. Hence, the disclosed approach enables more versatile manipulation of phase relationships beyond this limitation. In fact, it is possible to quantify how the disclosed approach increases the achievable relative phase desynchronization difference relative to sinusoidal forcing. If the PRC has non-trivial terms in its Fourier series up to order r, then it is possible to create an input waveform that results in an interaction function that is monotone on the interval $$\left[0, \left(2 - \frac{1}{r}\pi\right)\right].$$

Thus, an approach can be used to achieve maximal desynchronization of an oscillator ensemble by increasing the phase offset distribution range by a factor of $$2 - \frac{1}{r}$$

period.

NEW1. Extension of the Phase-Selective Entrainment Technique

The disclosed method may be used to selectively entrain an oscillator network in which the oscillators are weakly coupled. Specifically, consider the network $$\dot{\varphi}_j = \Delta\omega_j + \Lambda_v(\varphi_j) + \Sigma_{i=1}^{N} \alpha_{ij} K_{ij}(\varphi_j - \varphi_i), j=1, \ldots, N, \quad (1z)$$

where $\alpha_{ij}$ and $K_{ij}$ are the coupling influence of oscillator i on oscillator j and the coupling function between them, respectively, and $$\Lambda_v(\varphi) = \lim_{T \to \infty} \frac{1}{T} \int_0^T Z(\Omega t + \varphi) v(\Omega t) dt$$

is the interaction function in which Z is the phase response curve (PRC). The network of oscillators is defined as synchronized if the conditions (i) $\Lambda_v(\varphi_j^\infty) = -\Delta\omega_j - \Sigma_{i=1}^{N} \alpha_{ij} K_{ij}(\varphi_j - \varphi_i),$ (2z)

(ii) $\Lambda_v'(\varphi_j^\infty) < -\alpha_{ij} K_{ij}'(\varphi_j - \varphi_i), j=1, \ldots, N,$ (3z)

hold, where condition (ii) guarantees that the dynamical configuration is locally attractive and stable. Note that if the oscillators are not connected, then the coupling functions $K_{ij}$ do not exist so that the equation (1z) and conditions in (2z) and (3z) are identical to the uncoupled case, namely, $\Lambda_v(\varphi_j^\infty) = -\Delta\omega_j$ and $\Lambda_v'(\varphi_j^\infty) < 0$.

Figure 16:
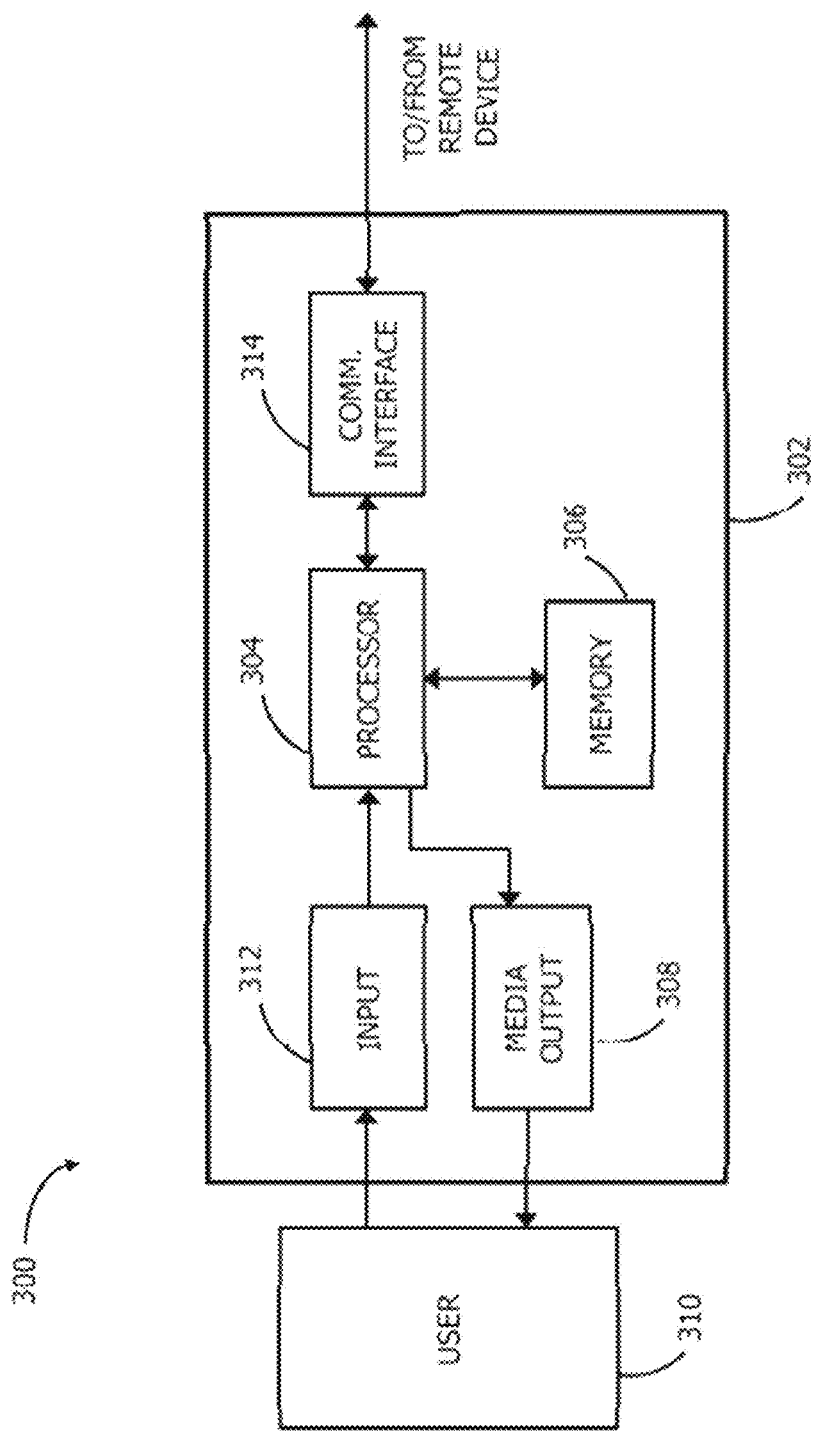
FIG. 16 illustrates an example configuration of a remote device system.

In various aspects, the methods described herein may be implemented using a remote and/or local computing device as described herein below. FIG. 16 illustrates an example configuration of a remote device system 300 and depicts an exemplary configuration of a remote or user computing device 302, such as requestor computing device. Computing device 302 includes a processor 304 for executing instructions. In some embodiments, executable instructions are stored in a memory area 306. Processor 304 may include one or more processing units (e.g., in a multi-core configuration). Memory area 306 is any device allowing information such as executable instructions and/or other data to be stored and retrieved. Memory area 306 may include one or more computer-readable media.

Client computing device 302 also includes at least one media output component 308 for presenting information to a user 310. Media output component 308 is any component capable of conveying information to user 310. In some embodiments, media output component 308 includes an output adapter such as a video adapter and/or an audio adapter. An output adapter is operatively coupled to processor 304 and operatively coupleable to an output device such as a display device (e.g., a liquid crystal display (LCD), organic light emitting diode (OLED) display, cathode ray tube (CRT), or "electronic ink" display) or an audio output device (e.g., a speaker or headphones). In some embodiments, media output component 308 is configured to present an interactive user interface (e.g., a web browser or client application) to user 310.

In some embodiments, client computing device 302 includes an input device 312 for receiving input from user 310. Input device 312 may include, for example, a keyboard, a pointing device, a mouse, a stylus, a touch sensitive panel (e.g., a touch pad or a touch screen), a camera, a gyroscope, an accelerometer, a position detector, and/or an audio input device. A single component such as a touch screen may function as both an output device of media output component 308 and input device 312.

Computing device 302 may also include a communication interface 314, which is communicatively coupleable to a remote device such as SE computing device. Communication interface 314 may include, for example, a wired or wireless network adapter or a wireless data transceiver for use with a mobile phone network (e.g., Global System for Mobile communications (GSM), 3G, 4G, or Bluetooth) or other mobile data network (e.g., Worldwide Interoperability for Microwave Access (WIMAX)).

Stored in memory area 306 are, for example, computer-readable instructions for providing a user interface to user 310 via media output component 308 and, optionally, receiving and processing input from input device 312. A user interface may include, among other possibilities, a web browser and client application. Web browsers enable users 310 to display and interact with media and other information typically embedded on a web page or a website from a web server associated with a merchant. A client application allows users 310 to interact with a server application.

Figure 17:
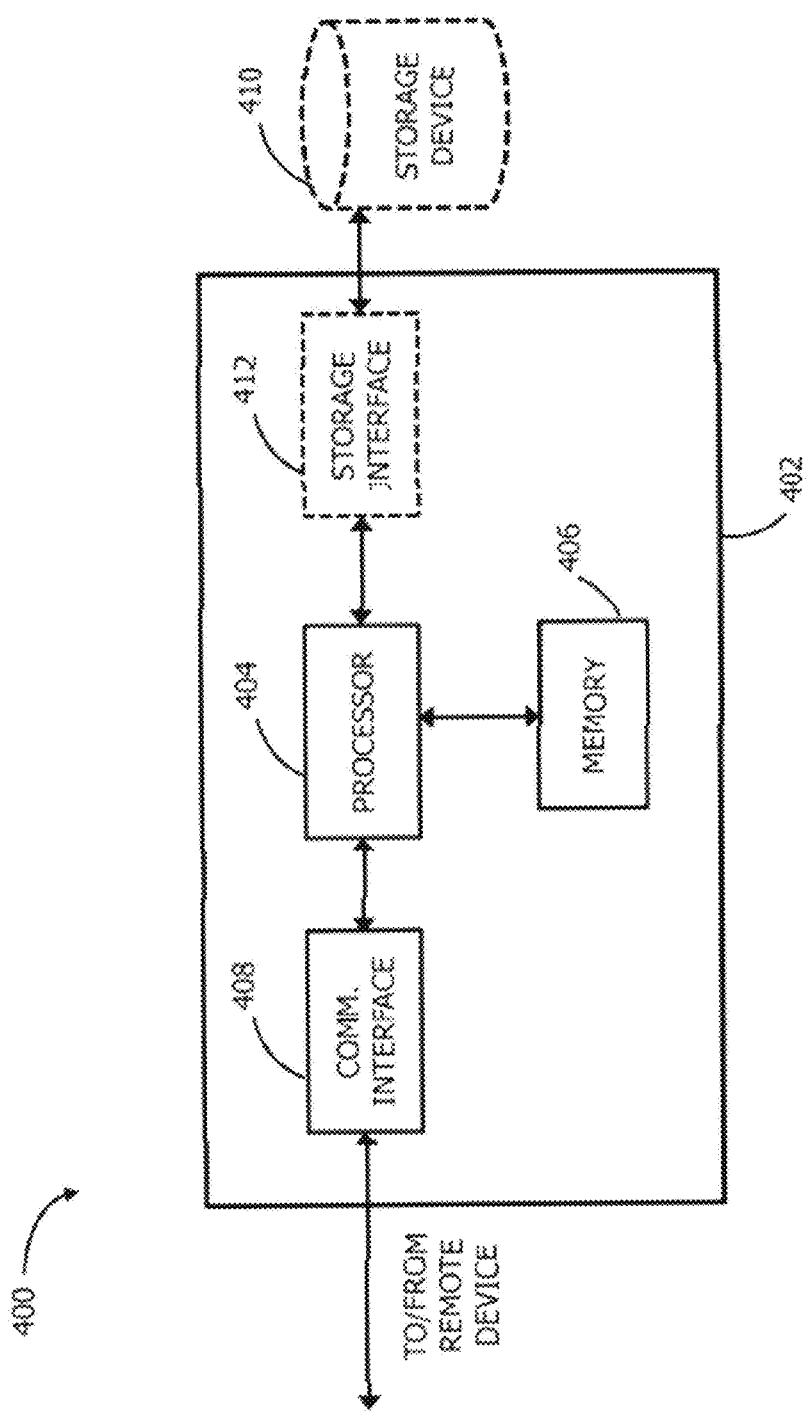
FIG. 17 illustrates an example configuration of a server system.

FIG. 17 illustrates an example configuration of a server system 400, and depicts an example configuration of a server computing device 402. Server computing device 402 includes a processor 404 for executing instructions. Instructions may be stored in a memory area 406, for example. Processor 404 may include one or more processing units (e.g., in a multi-core configuration).

Processor 404 is operatively coupled to a communication interface 408 such that server computing device 402 is capable of communicating with a remote device such as computing device 302 shown in FIG. 16 or another server computing device 402. For example, communication interface 408 may receive requests from requestor computing device 106 via the Internet.

Processor 404 may also be operatively coupled to a storage device 410. Storage device 410 is any computer-operated hardware suitable for storing and/or retrieving data. In some embodiments, storage device 410 is integrated in server computing device 402. For example, server computing device 402 may include one or more hard disk drives as storage device 410. In other embodiments, storage device 410 is external to server computing device 402 and may be accessed by a plurality of server computing devices 402. For example, storage device 410 may include multiple storage units such as hard disks or solid state disks in a redundant array of inexpensive disks (RAID) configuration. Storage device 410 may include a storage area network (SAN) and/or a network attached storage (NAS) system.

In some embodiments, processor 404 is operatively coupled to storage device 410 via a storage interface 412. Storage interface 412 is any component capable of providing processor 404 with access to storage device 410. Storage interface 412 may include, for example, an Advanced Technology Attachment (ATA) adapter, a Serial ATA (SATA) adapter, a Small Computer System Interface (SCSI) adapter, a RAID controller, a SAN adapter, a network adapter, and/or any component providing processor 404 with access to storage device 410.

Memory areas 306 (shown in FIG. 3) and 406 may include, but are not limited to, random access memory (RAM) such as dynamic RAM (DRAM) or static RAM (SRAM), read-only memory (ROM), erasable programmable read-only memory (EPROM), electrically erasable programmable read-only memory (EEPROM), and non-volatile RAM (NVRAM). The above memory types are for example only, and are thus not limiting as to the types of memory usable for storage of a computer program.

EXAMPLES

The following examples demonstrate various aspects of the disclosure.

Example 1: Electrochemical Dissolution of Nickel Using Potential Actuation

To demonstrate the method for controlling the phase structure of an ensemble of heterogeneous oscillators, the following experiments were conducted. Electrochemical oscillations associated with the electrochemical dissolution of nickel in concentrated sulfuric acid solution using potential actuation was controlled using the method described above.

A schematic description of the experimental setup is depicted in FIG. 1. As illustrated in FIG. 1, the working electrode (WE) was composed of an array of nickel wires, the counter electrode (CE) was a Pt coated Ti wire, and the reference electrode (RE) was Hg/Hg2SO4/sat. K2SO4. The control waveform was a potential signal generated by a high-speed multifunction data acquisition (DAQ) device (M Series DAQ PXI-6255, National Instruments). The control waveform was implemented in the WE by a potentiostat (Bank Instruments) as a superimposed signal on the applied baseline potential V0. Each nickel wire was connected in series to an individual resistance Rind.

The apparatus consisted of twenty nickel wires that functioned as working electrodes (WE), with diameters of 0.69 mm, spaced by 2.0 mm, and embedded in epoxy resin. Prior to the electrochemical measurements, each nickel wire of the WE was polished with sandpaper with one of six levels of roughness, ranging from 180 to 4000 grit. The current of each working electrode was monitored independently. During the anodic dissolution of nickel within the WE, the spontaneous formation of self-sustained electrochemical oscillations driven by the presence of a negative differential resistance was observed.

Once the WE were placed in the electrochemical cell, a slow positive sweep of 0.01 V s−1 from 0 V to a constantly applied potential V0 was conducted in order to form a thin passive layer on the electrode surface. This baseline was set in reference to an Hg/Hg2SO4/sat. K2SO4 reference electrode (RE) in the electrochemical cell, containing a 1.6 mm diameter Pt-coated Ti wire counter electrode (CE), and 3.0 mol L−1 sulfuric acid solution at constant temperature of 10 deg C. The potential V0 was initially set using the potentiostat (Bank Instruments) at a value for which the oscillation was close to the Hopf bifurcation, which was approximately 1.15 V. Inputs to the oscillating system consisted of an additional potential V superimposed onto the baseline potential V0 using the potentiostat.

Soon after, the PRCs were measured simultaneously for the WE by the automatic procedure of applying a pseudo-randomly timed potential pulse sequence of −0.20 V with pulse-width of 0.05 seconds and post-processing the observed current using the pulse perturbation procedure disclosed herein above. Measurements of the current oscillations in the electrochemical reactions were obtained by an interface to the high-speed multifunction data acquisition (DAQ) device with a sample rate of 200 Hz. Simultaneously, the periodic potential perturbations v with determined amplitude scaling A and frequency $\Omega$ were applied in the electrochemical oscillator ensemble using the controlled potentiostat to superimpose the waveform onto the applied baseline voltage V0. Both interfaces were written in LabView. Each control waveform was generated based on the PRC obtained prior to conducting the experiment and the targeted interaction function was generated from the desired set of phase offsets for the oscillators.

FIG. 2A, FIG. 2B, FIG. 2C, FIG. 2D, FIG. 2E, and FIG. 2F are graphs showing a series of interaction functions and control waveforms used to enable the switching pattern "O→K→O" as described in additional detail below. FIG. 2A, FIG. 2C, and FIG. 2E illustrate the best approximations to the desired interaction functions, and FIG. 2B, FIG. 2D, and FIG. 2F; Right: one cycle of the resulting control waveform, obtained using the control design procedure described herein, which is applied to entrain the electrochemical oscillators. The ensemble is grouped into four clusters of quantities (N1;N2;N3;N4)=(7;7;3;3). Cluster 1 for oscillators j=1 to 7 (blue), cluster 2 for j=8 to 14 (cyan), cluster 3 for j=15 to 17 (yellow) and cluster 4 for j=18 to 20 (red). Phase assignment for pattern "O": $(\varphi_1^*, \varphi_2^*, \varphi_3^*, \varphi_4^*)$ =(0,0,π,π); (b): Precursor of pattern "K": $(\varphi_2^*, \varphi_3^*)$=(π, 0); (c): Pattern "K": $(\varphi_1^*, \varphi_2^*, \varphi_3^*, \varphi_4^*)$=(0, π, 0, π). FIG. 2A, FIG. 2C, and FIG. 2E display the interaction functions and FIG. 2B, FIG. 2D, and FIG. 2F display the respective control waveforms (used to entrain the electrochemical oscillators for the pattern switching procedure OKO described in FIG. 5A, FIG. 5B, FIG. 5C, FIG. 5D, FIG. 5E, FIG. 5F, FIG. 5G, FIG. 5H, FIG. 5I, and FIG. 5J. An electrochemical oscillator ensembles with clusters of size (N1;N2;N3;N4)=(7;7;3;3) were selected by tuning the mean natural frequency of the oscillations in the following order: cluster 1 with $\omega_1$=0:390 Hz (electrodes j=1 to 7 in blue), cluster 2 with $\omega_2$=0.406 Hz (electrodes j=8 to 14 in cyan), cluster 3 with $\omega_3$=0.427 Hz (electrodes j=15 to 17 in yellow) and cluster 4 with $\omega_4$=0: 442 Hz (electrodes j=18 to 20 in red). The phase assignments for pattern switching OKO are listed in FIG. 5A-5J.

Example 2: Phase Assignment Applications to Different Systems

The phase assignment method disclosed herein was applied to entrain oscillatory systems arising from different domains. In particular, robust global entrainment waveforms were designed to form phase patterns (synchronization, desynchronization, and clustering) in a collection of oscillatory systems, including Hodgkin-Huxley neurons, Morris-Lecar neurons, and electro-chemical oscillators.

Entrainment of Hodgkin-Huxley Neurons

The Hodgkin-Huxley (HH) model (see Appendix A) describes the propagation of action potentials in neurons, specifically the squid giant axon, and is used as a canonical example of neural oscillator dynamics. The phase-selective entrainment technique was applied to entrain HH neurons.

Hodgkin-Huxley Model

The Hodgkin-Huxley model describes the propagation of action potentials in neurons, specifically the squid giant axon, and is used as a canonical example of neural oscillator dynamics. The equations are $$\dot{V}=I_b+I(t)-\bar{g}_{Na}H(V-V_{Na})m^3-\bar{g}_K(V-V_k)n^4-\bar{g}_L(V-V_L),$$

$$\dot{m}=a_m(V)(1-m)-b_m(V)(m),$$

$$\dot{h}=a_h(V)(1-h)-b_h(V)(h),$$

$$\dot{n}=a_n(V)(1-n)-b_n(V)(n),$$

$$a_m(V)=0.1(V+40)/(1-\exp(-(V-40)/10)),$$

$$b_m(V)=4\exp(-(V+65)/18),$$

$$a_h(V)=0.07\exp(-(V+65)/20),$$

$$b_h(V)=1/(1+\exp(-(V+35)/10)),$$

$$a_n(V)=0.01(V+55)/(1-\exp(-(V+55)/10)),$$

$$b_n(V)=0.125\exp(-(V+65)/80).$$

The variable V is the voltage across the axon membrane, m, h, and n are the ion gating variables, $I_b$ is a baseline current that induces the oscillation, and I(t) is the control input. The units of V are millivolts and the units of time are milliseconds. Nominal parameters are $V_{Na}=50$ mV, $V_K=-77$ mV, $V_L=-54.4$ mV, $\bar{g}_{Na}=120$ mS/cm$^2$, $\bar{g}_K=36$ mS/cm$^2$, $\bar{g}_L=0.3$ mS/cm$^2$, $I_b=10$ μA/cm$^2$, and c=1 μF/cm$^2$, for which the period of oscillation is $T=14.63842\pm10^{-5}$ ms.

Uncoupled HH Neurons

Figure 12A:
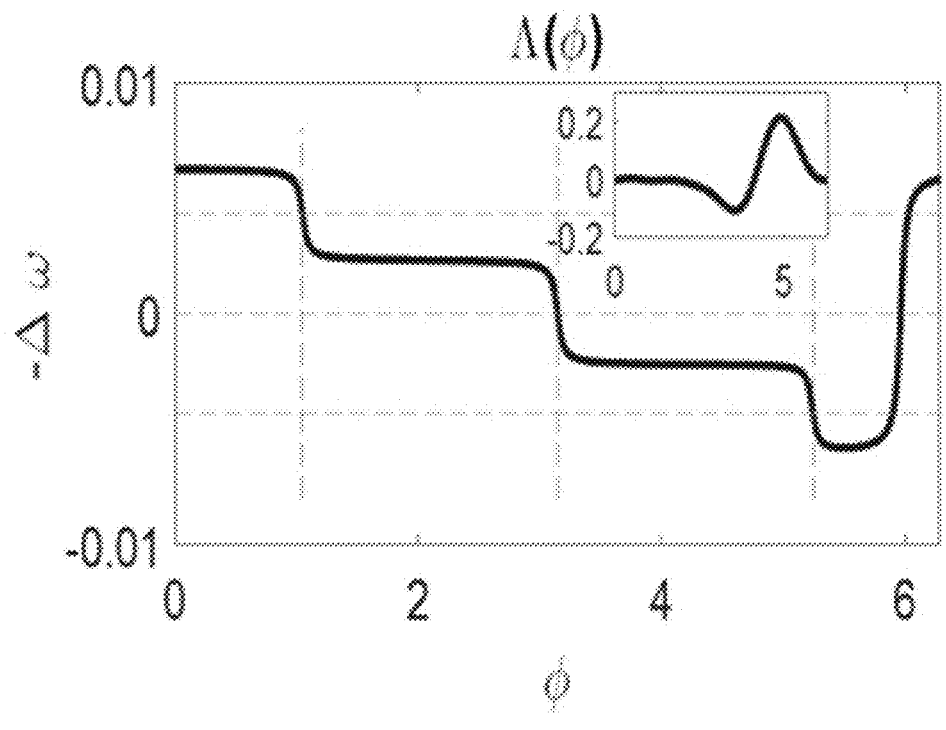
FIG. 12A is a graph showing an interaction function $\Lambda_\nu^r(\varphi)$ designed using an r=5 order Fourier series fit to an ideal $\Lambda_\nu(\varphi)$ designed using the monotone step method. Inset: PRC of Hodgkin-Huxley (HH) System.
Figure 12B:
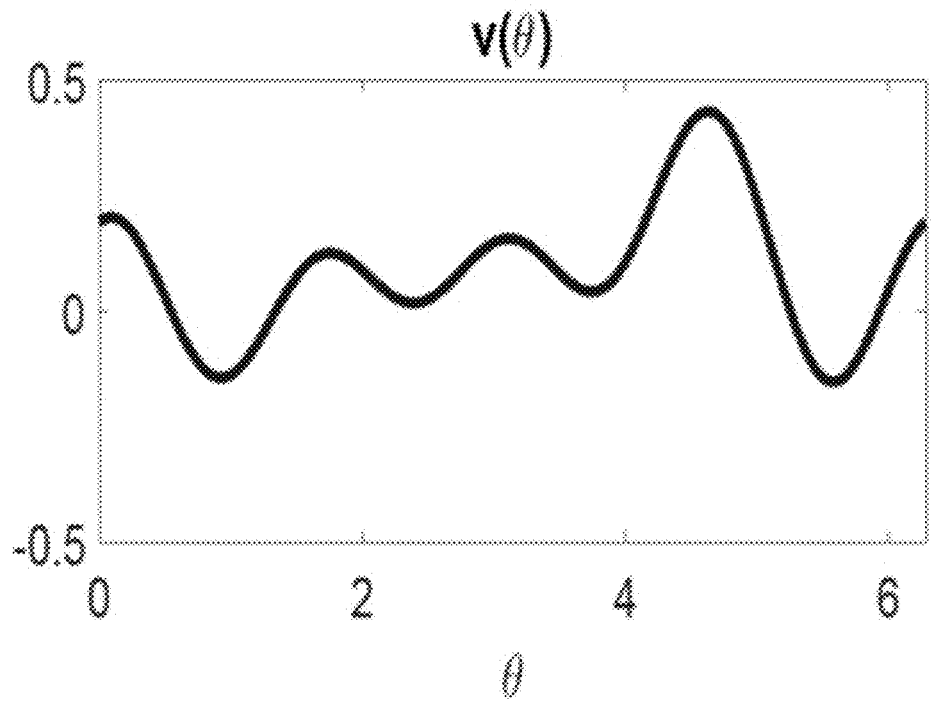
FIG. 12B is a graph showing an input waveform $v(\theta)$ resulting from Fourier inversion of $\Lambda_\nu^r(\varphi)$.
Figure 12C:
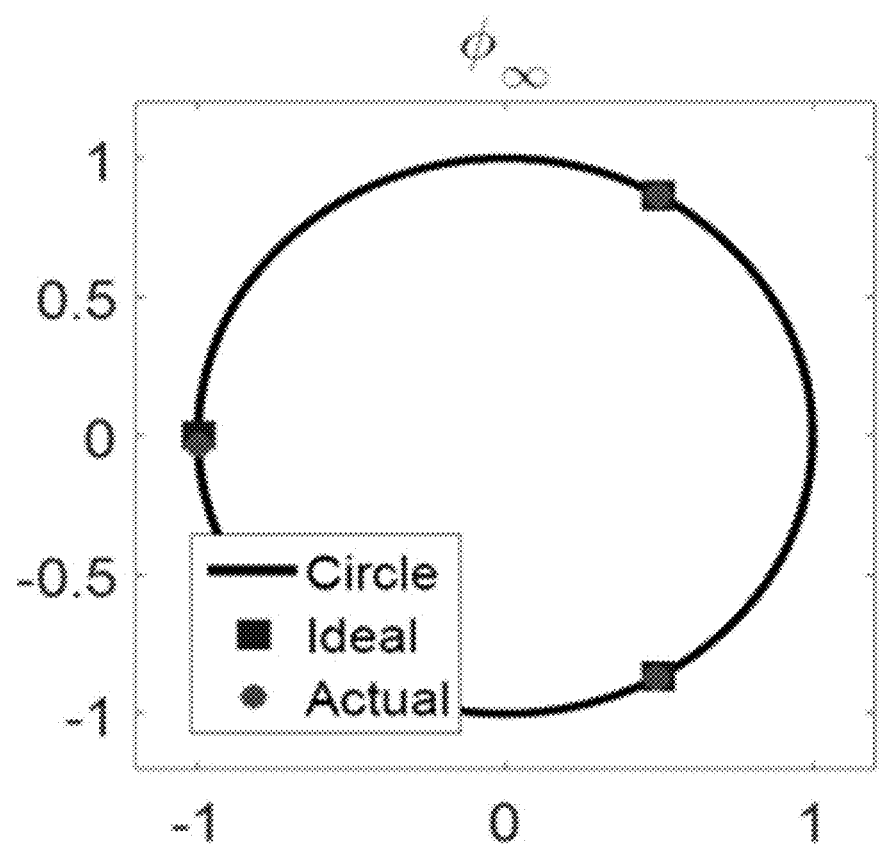
FIG. 12C is a graph showing an ideal, designed and actual phase pattern resulting from applying $v(\theta)$ to a three uncoupled HH phase models with frequencies at 1.01, 1, and 0.99 times the natural frequency $\omega$.

An entrainment phase pattern $\{\varphi_1^\infty,\varphi_2^\infty,\varphi_3^\infty\}=\{\pi/3, \pi, 5\pi/3\}$ for three oscillators (N=3) with the frequencies $\{\omega_1, \omega_2, \omega_3\}=\{0.99\omega, \omega, 1.01\omega\}$ was created, where ω is the natural frequency. The designed interaction function $N_v^r(\varphi)$ and the optimal waveform $v^r(\theta)$ are shown in FIG. 12A and FIG. 12B, respectively. The desired phase structure stabilizes after about 50 input cycles, as shown in FIG. 12C.

HH Neuronal Networks

Figure 13A:
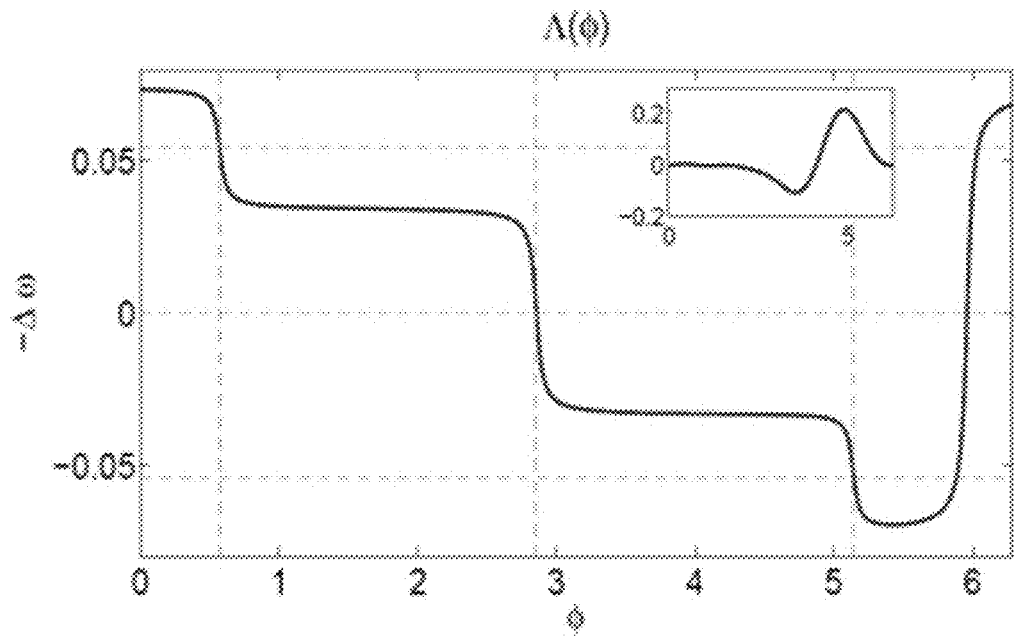
FIG. 13A is a graph showing an interaction function $\Lambda_\nu^r(\varphi)$ designed using a r=5 order Fourier series fit to an ideal $\Lambda_\nu(\varphi)$ designed using the monotone step method. Inset: PRC of Hodgkin-Huxley (HH) System.
Figure 13B:
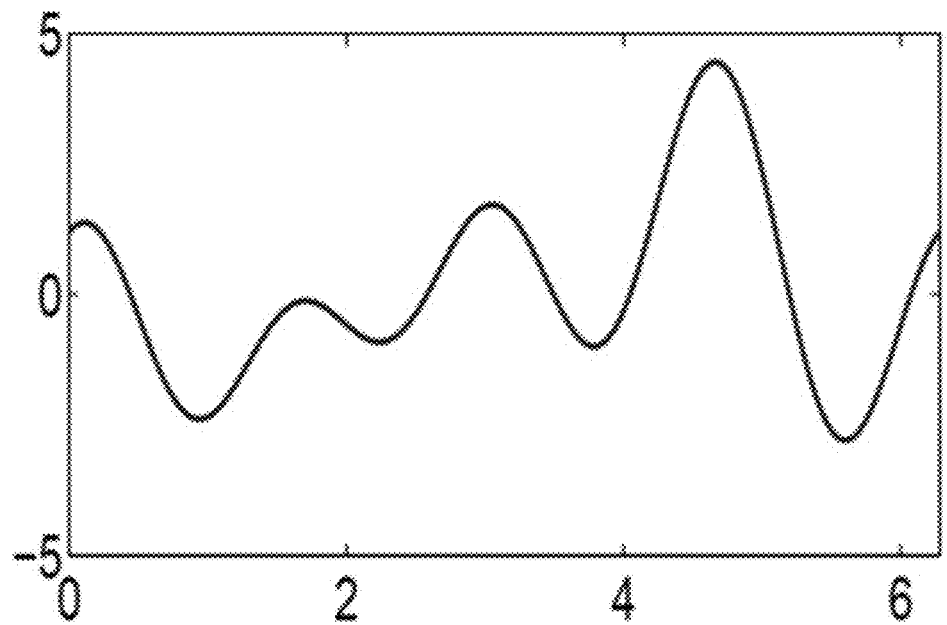
FIG. 13B is a graph showing an input waveform $v(\theta)$ resulting from Fourier inversion of $\Lambda_\nu^r(\varphi)$.
Figure 13C:
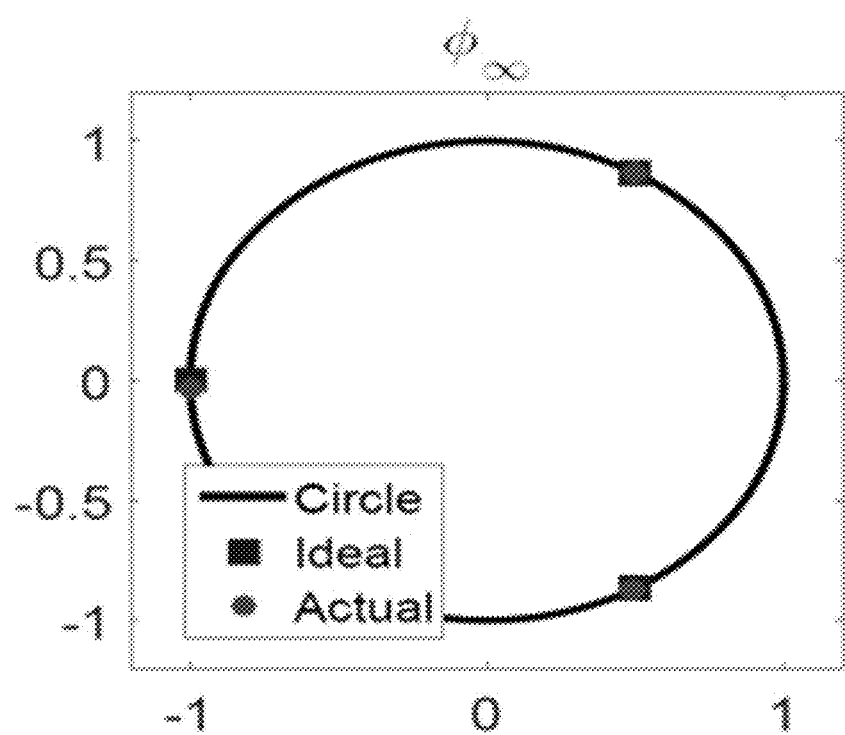
FIG. 13C is a graph showing an ideal, designed and actual phase pattern resulting from applying v(θ) to a network of three HH neurons with frequencies at 1.01, 1, and 0.99 times the natural frequency ω.

The same entrainment phase pattern $\{\varphi_1^\infty,\varphi_2^\infty,\varphi_3^\infty\}=\{\pi/3, \pi, 5\pi/3\}$ was created for the same oscillators as described above with their frequencies $\{\omega_1, \omega_2, \omega_3\}=\{0.99\omega, \omega, 1.01\omega\}$ and consider the case when they are weakly coupled through the coupling functions $K_{ij}(\varphi)=\cos(\varphi)$ with the coupling strength $\alpha_{ij}=0.05$ for i,j=1, 2, 3. The designed interaction function and the optimal waveform $\Lambda_v^r(v)$ are shown in FIG. 13A and FIG. 13B, respectively. The desired phase structure stabilizes after about 50 input cycles, as shown in FIG. 13C.

Entrainment of Morris-Lecar Neurons

The Morris-Lecar model was originally proposed to capture the oscillating voltage behavior of giant barnacle muscle fibers. Over the past years this model has been extensively studied and used as a standard model for representing many different real neurons that are experimentally observable. For example, it has been found that Morris-Lecar PRC is extremely similar to the experimentally observed PRCs of Aplysia motoneuron.

Morris-Lecar Model

The dynamics of the Morris-Lecar neuron is described by $$C\dot{V}=(I^b+I)=g_{Ca}m_\infty(V_{Ca}-V)+g_Kw(V_K-V)+g_Lw(V_L-V),$$

$$\dot{w}=\phi(\omega_\infty-\omega)/\tau_\omega(V),$$

where $m_\infty=0.5[1+\tan h((V-V_1)/V_2)]$, $\omega_\infty=0.5[1+\tan h((V-V_3)/V_4)]$, $\tau_\omega=1/\cos h[(V-V_3)/(2V_4)]$, and parameter values for the Morris-Lecar neuron are given as:

$\phi=0.5, I^b=0.09$μA/cm$^2$, $V_L=-0.01$ mV, $v_2=0.15$ mV, $V_3=0.1$ mV, $v_4=0.145$ mV, $g_{Ca}=1$ mS/cm$^2$, $V_K=-0.7$ mV, $V_L=-0.5$ mV, $g_K=2$ mS/cm$^2$, $g_L=0.5$ mS/cm$^2$, C=1 μF/cm$^2$.

Figure 14A:
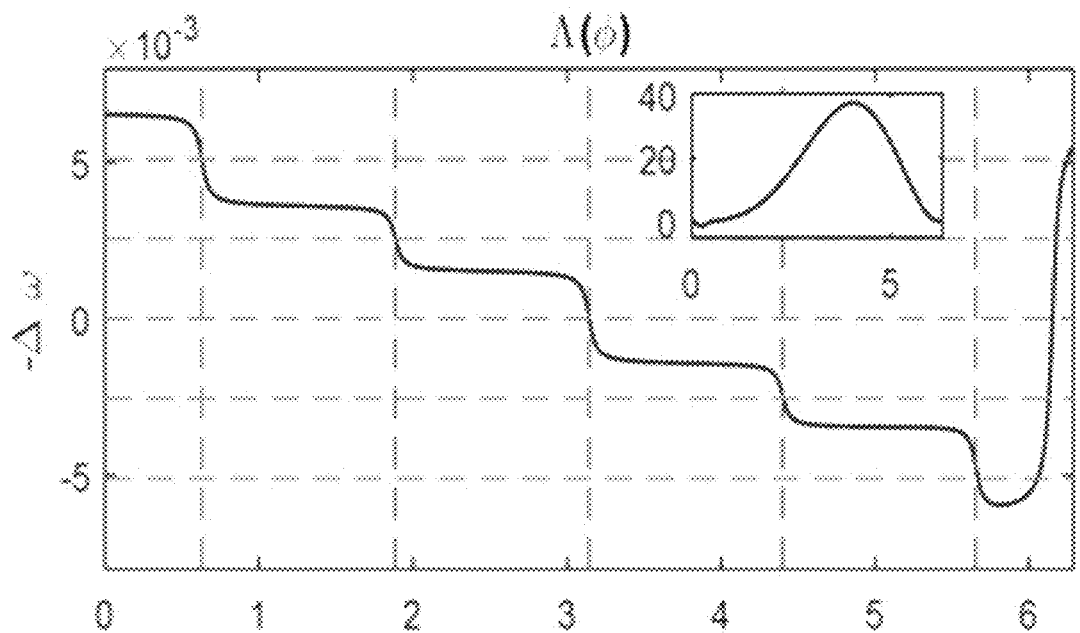
FIG. 14A is a graph showing an interaction function $\Lambda_v^r(\varphi)$ designed using a Fourier series fit to an ideal $\Lambda_v(\varphi)$ designed using the monotone step method. Inset: PRC of Morris-Lecar (ML) System.
Figure 14B:
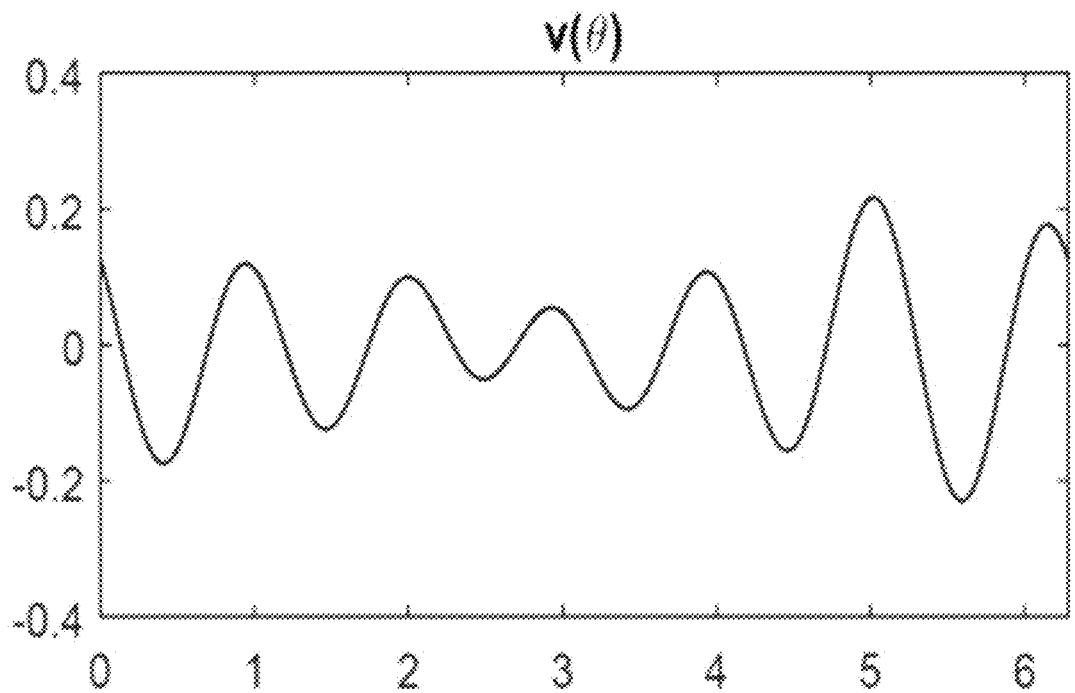
FIG. 14B is a graph showing an input waveform v(θ) resulting from Fourier inversion of $\Lambda_v^r(\varphi)$.
Figure 14C:
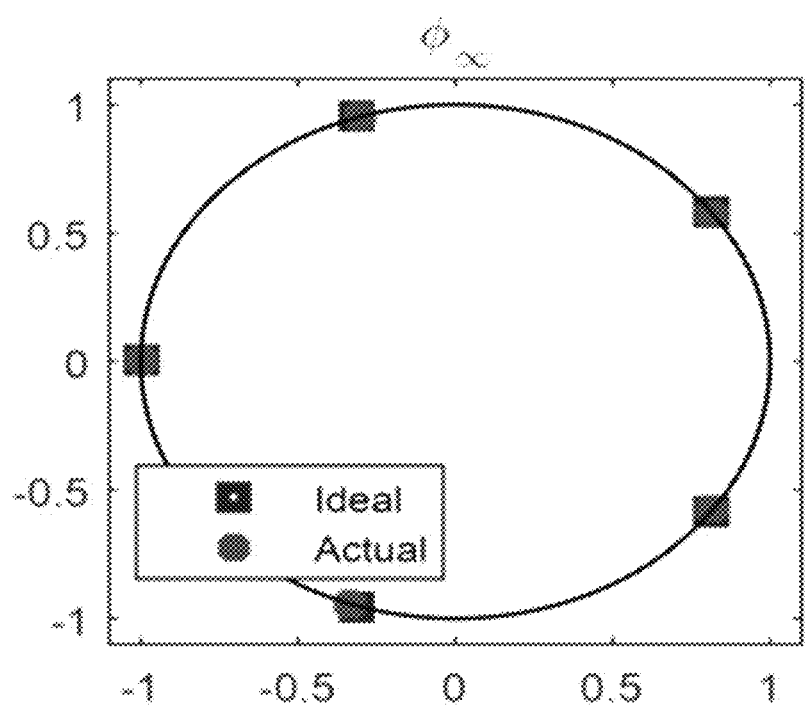
FIG. 14C is a graph showing an ideal and an actual phase pattern resulting from applying v(θ) to a network of five weakly coupled ML neurons with frequencies at 0.98, 0.99, 1, 1.01, 1.02 times the natural frequency ω.

A uniform entrainment pattern was created $\{\varphi_1^\infty,\varphi_2^\infty,\varphi_3^\infty,\varphi_4^\infty,\varphi_5^\infty\}=\{\pi/5, 3\pi/5, \pi, 3\pi/5, 7\pi/5, 9\pi/5\}$ for five weakly coupled oscillators (N=5) with the frequencies $\{\omega_1,\omega_2,\omega_3,\omega_4,\omega_5\}=\{0.98\omega, 0.99\omega, \omega, 1.01\omega, 1.02\omega\}$, where ω is the natural frequency. The coupling functions are $K_{ij}(\varphi)=\sin(\varphi)+\cos(\varphi)$ with the coupling strength $\alpha_{ij}=0.02$ for i, j= 1, . . . , 5. The designed interaction function $\Lambda_v^r(\varphi)$ and the optimal waveform $v^r(\theta)$ are shown in FIG. 14A and FIG. 14B, respectively. The desired desynchronization phase structure stabilizes after 150 input cycles, as shown in FIG. 13C.

Entrainment of a Network of Chemical Oscillators

Figure 15A:
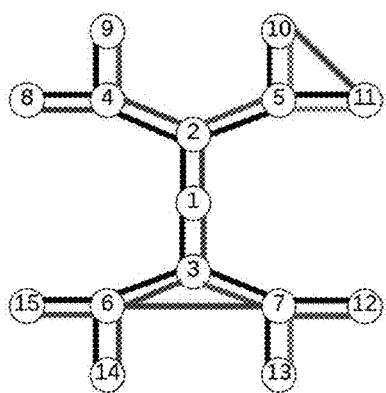
FIG. 15A is a schematic diagram showing a configuration of a network of 15 chemical oscillators.
Figure 15B:
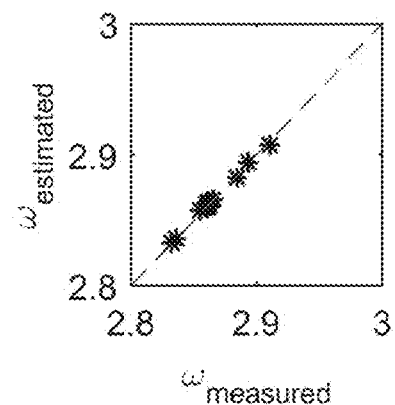
FIG. 15B is a graph showing a distribution of frequencies of the oscillators.
Figure 15C:
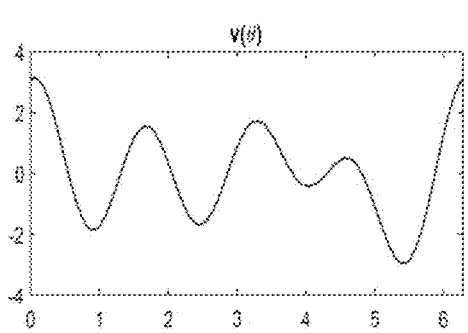
FIG. 15C is a graph showing a designed input waveform v(θ).
Figure 15D:
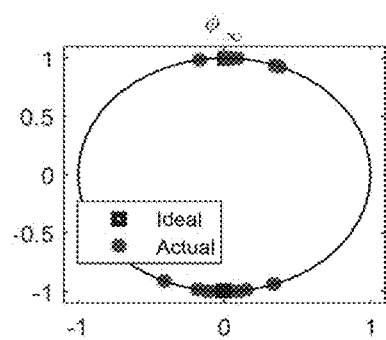
FIG. 15D is a graph showing an ideal and an actual phase pattern resulting from applying v(θ).

A two-cluster entrainment pattern in a network of 15 chemical oscillators was created as shown in FIG. 15A. The frequency distribution of these 15 oscillators is shown in FIG. 15B. The designed optimal waveform $v^r(\theta)$ and the desired phase structure are shown in FIG. 15C and FIG. 15D, respectively.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A system for entraining a non-linear oscillator ensemble in an entrained phase pattern, the system comprising:

an entrainment control device operatively coupled to each of N non-linear oscillators of the non-linear oscillator ensemble, the entrainment control device is configured to deliver a 2π-periodic control signal v(θ) to each of the N non-linear oscillators, wherein each of the N non-linear oscillators endogenously oscillates at a natural frequency $\omega_j$ with a corresponding natural phase $\psi_j$, wherein j ranges from 1 to N;

an entrainment pattern generator configured to determine a 2π-periodic interaction function $\Lambda_v$ comprising a relationship between an entrained frequency shift Δω and an entrained phase offset φ for the N non-linear oscillators, the 2π-periodic interaction function $\Lambda_v$ defining the entrained phase pattern comprising an entrained phase offset $\varphi_j$ for each of the N non-linear oscillators, each entrained phase offset $\varphi_j$ consisting of a difference between the natural phase $\psi_j$ and an entrained phase θ;

an entrainment control signal generator configured to determine the 2π-periodic control signal v(θ) using the 2π-periodic interaction function $\Lambda_v$ and a phase response curve Z(θ), the phase response curve Z(θ) characterizing a phase shift of the N non-linear oscillators in response to a weak perturbation, wherein the $2\pi$-periodic control signal $v(\theta)$ is configured to:

detune the natural frequency $\omega_j$ by the entrained frequency shift $\Delta\omega_j$ for each of the N non-linear oscillators, the entrained frequency shift $\Delta\omega_j$ consisting of a difference between the natural frequency $\omega_j$ and an entrained frequency $\Omega$; and shift each of the natural phases $\omega_j$; by the entrained phase offset $\varphi_j$ for each of the N non-linear oscillators.

2. The system of claim 1, wherein the N non-linear oscillators are detuned to the same entrained frequency $\Omega$ consisting of a mean of the natural frequencies $\omega_j$ of the N non-linear oscillators.

3. The system of claim 1, wherein each entrained phase offset $\varphi_j$ is independently selected from a range of entrained phase offsets ranging between 0 and $2\pi$.

4. The system of claim 1, wherein the $2\pi$-periodic interaction function $\Lambda_v$ comprises a plurality of phase/detuning pairs $(\varphi_j^*, \Delta\omega_j)$, each phase/detuning pair $(\varphi_j^*, \Delta\omega_j)$ defining an average entrained phase offset $\varphi_j^*$ and corresponding entrained frequency shift $\Delta\omega_j$ for each of the N non-linear oscillators in accordance with the entrained phase pattern, and wherein the $2\pi$-periodic interaction function $\Lambda_v$ further comprises a negative derivative $$\frac{d}{d\varphi}\Lambda_v < 0$$

at each phase/detuning pair $(\varphi_j^*, \Delta\omega_j)$.

5. The system of claim 4, wherein the $2\pi$-periodic interaction function $\Lambda_v$ comprises an interaction function $\Lambda_v^*$, wherein:

$$\Lambda_v^*(\varphi) = r_1 + (r_1 - r_{N+1})\sigma\left(\frac{\varphi - s_1}{h_{N+1}}\right) + \sum_{j=2}^{N}(r_{j+1} - r_j)\sigma\left(\frac{\varphi - \varphi_j^*}{h_j}\right) +$$

$$\sum_{j=2}^{N}(r_{j+1} + r_j)\sigma\left(\frac{\varphi + 2\pi - \varphi_j^*}{h_j}\right) + (r_1 - r_{N+1})\sigma\left(\frac{\varphi - s_{N+1}}{h_{N+1}}\right),$$

$$r_1 = -\Delta\omega_1 + \frac{1}{2}(-\Delta\omega_1 + \Delta\omega_2), r_j = \frac{1}{2}(-\Delta\omega_1 + \Delta\omega_{j-1}) \text{ for } j = 2, \ldots, N,$$

$$r_{N+1} = -\Delta\omega_N + \frac{1}{2}(-\Delta\omega_{N-1} + \Delta\omega_N), s_1 = \frac{1}{2}(\varphi_1^* + \varphi_N^* - 2\pi),$$

$$s_j = \frac{1}{2}(\varphi_j^* + \varphi_{j-1}^*) \text{ for } j = 2, \ldots, N, s_{N+1} = \frac{1}{2}(\varphi_1^* + \varphi_N^* + 2\pi),$$

$$h_1 = \min\{s_2 - \varphi_1^*, (\varphi_1^* - s_1)/2\},$$

$$h_j = \min\{s_{j+1} - \varphi_j^*, \varphi_j^* - s_j\}, \text{ for } j = 2, \ldots, N,$$

$$h_{N+1} = \min\left\{\frac{1}{2}(s_{N+1} - \varphi_N^*), \frac{1}{2}(\varphi_1^* - s_1)\right\},$$

$$\sigma(x) = \frac{1}{2}(erf(2x) + 1), erf(x) = \frac{2}{\sqrt{\pi}}\int_0^x e^{-t^2} dt.$$

6. The system of claim 5, wherein the $2\pi$-periodic control signal $v(\theta)$ is given by:

$$v(\theta) \approx v^r(\theta) = \frac{c_0}{2} + \sum_{n=1}^{r} [c_n \cos(n\theta) + d_n \sin(n\theta)],$$

wherein $$c_0 = 2\frac{f_0}{a_0}\chi[a_0 \neq 0], c_n = 2\frac{f_n a_n + b_n g_n}{a_n^2 + b_n^2}\chi[a_n^2 + b_n^2 \neq 0],$$

$$d_n = 2\frac{f_n b_n + a_n g_n}{a_n^2 + b_n^2}\chi[a_n^2 + b_n^2 \neq 0],$$

$\chi[A]=1$ if A is true, and $\chi[A]=0$ otherwise, $a_0$, $a_n$, and $b_n$ are obtained from a truncated Fourier-series expression of a phase response curve given by:

$$Z(\theta) \approx Z^r(\theta) = \frac{a_0}{2} + \sum_{n=1}^{r}[a_n\cos(n\theta) + b_n\sin(n\theta)],$$

and $f_o$, $f_n$, and $g_n$ are obtained from a truncated Fourier-series expression of an interaction function $\Lambda_v^r$ given by:

$$\Lambda_v^r(\varphi) = \frac{f_0}{2} + \frac{1}{2}\sum_{n=1}^{r}[f_n\cos(n\varphi) + g_n\sin(n\varphi)],$$

wherein $$f_0 = \frac{a_0 c_0}{2}, f_n = a_n c_n + b_n d_n, \text{ and } g_n = b_n c_n - a_n d_n.$$

7. The system of claim 1, wherein the phase response curve $Z(\theta)$ consists of a mean of individual phase response curves $Z_j(\theta)$, each individual phase response curve $Z_j(\theta)$ corresponding to the $j^{th}$ non-linear oscillator of the N non-linear oscillators.

8. The system of claim 7, further comprising an oscillator characterization device operatively coupled to each of the N non-linear oscillators, the oscillator characterization device configured to determine, for each of the N non-linear oscillators, at least one of the natural frequency $\omega_j$, the natural phase $\psi_j$, the phase response curve $Z_j(\theta)$, and any combination thereof.

9. The system of claim 8, wherein the oscillator characterization device is configured to determine a phase response curve $Z(\psi(t_o))$ for each of the N oscillators by:

measuring a baseline phase $\psi_o(t_o+NT)$ at N cycles after the absence of an applied pulse and a perturbed phase $\psi_1(t_o+NT)$ at N cycles after the applied pulse, the applied pulse comprising an impulse with a duration $\Delta t$ and a magnitude M; and determining $Z(\psi(t_o))$ according to:

$$Z(\psi(t_0)) = \frac{\psi_1(t_0 + NT) - \psi_0(t_0 + NT)}{M\Delta t}.$$

10. The system of claim 1, wherein the system is configured to entrain the oscillator ensemble in a series of entrained phase patterns by sequentially determining a series of $2\pi$-periodic interaction functions $\Lambda_v$ defining the series of entrained phase patterns, sequentially determining the series of $2\pi$-periodic control signals $v(\theta)$ using the series of $2\pi$-periodic interaction functions $\Lambda_v$ and the phase response curve $Z(\theta)$, and sequentially delivering the series of $2\pi$-periodic control signals $v(\theta)$ to each of the N non-linear oscillators.

* * * * *